United States Patent
Chen et al.

(10) Patent No.: US 12,366,798 B2
(45) Date of Patent: *Jul. 22, 2025

(54) LITHOGRAPHY MASK AND METHODS

(71) Applicant: Taiwan Semiconductor Manufacturing Co., Ltd., Hsinchu (TW)

(72) Inventors: Chien-Cheng Chen, Hsinchu (TW); Huan-Ling Lee, Hsinchu (TW); Ta-Cheng Lien, Hsinchu (TW); Chia-Jen Chen, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 231 days.

This patent is subject to a terminal disclaimer.

(21) Appl. No.: 17/716,849

(22) Filed: Apr. 8, 2022

(65) Prior Publication Data

US 2022/0390827 A1    Dec. 8, 2022

Related U.S. Application Data

(60) Provisional application No. 63/197,651, filed on Jun. 7, 2021.

(51) Int. Cl.
*G03F 1/26* (2012.01)
*G03F 1/32* (2012.01)
*G03F 1/38* (2012.01)
*H01L 21/027* (2006.01)

(52) U.S. Cl.
CPC .................. *G03F 1/26* (2013.01); *G03F 1/32* (2013.01); *G03F 1/38* (2013.01); *H01L 21/0273* (2013.01)

(58) Field of Classification Search
CPC .................................................. G03F 1/26–34
See application file for complete search history.

(56) References Cited

U.S. PATENT DOCUMENTS

| | | | | |
|---|---|---|---|---|
| 5,750,290 | A * | 5/1998 | Yasuzato | G03F 1/32 430/5 |
| 10,859,903 | B1 | 12/2020 | Yu et al. | |
| 2004/0086788 | A1 * | 5/2004 | Shiota | G02B 5/3083 430/5 |
| 2015/0268552 | A1 * | 9/2015 | Nam | G03F 1/26 430/5 |
| 2015/0331309 | A1 * | 11/2015 | Hsueh | G03F 1/32 430/5 |
| 2018/0059531 | A1 * | 3/2018 | Lin | G03F 1/38 |
| 2018/0259841 | A1 * | 9/2018 | Nozawa | G03F 1/80 |

(Continued)

FOREIGN PATENT DOCUMENTS

DE    102015104473 A1    11/2015
JP        06301195 A *    10/1994
(Continued)

*Primary Examiner* — Martin J Angebranndt
(74) *Attorney, Agent, or Firm* — Seed IP Law Group LLP

(57) ABSTRACT

A lithography mask including a substrate, a phase shift layer on the substrate and an etch stop layer is provided. The phase shift layer is patterned and the substrate is protected from etching by the etch stop layer. The etch stop layer can be a material that is semi-transmissive to light used in photolithography processes or it can be transmissive to light used in photolithography processes.

18 Claims, 11 Drawing Sheets

(56) References Cited

U.S. PATENT DOCUMENTS

| | | |
|---|---|---|
| 2019/0137862 A1 | 5/2019 | Yang et al. |
| 2019/0265585 A1* | 8/2019 | Ikebe et al. |
| 2020/0064726 A1* | 2/2020 | Nozawa .................... G03F 1/84 |
| 2024/0069431 A1* | 2/2024 | Hsieh ........................ G03F 1/32 |

FOREIGN PATENT DOCUMENTS

| | | | | |
|---|---|---|---|---|
| JP | 2010009001 A | * | 1/2010 | |
| JP | 2015038564 A | * | 2/2015 | |
| JP | 2020020868 A | * | 2/2020 | |
| KR | 2011105520 A | * | 9/2011 | ............... G03F 1/08 |
| KR | 2014020530 A | * | 2/2014 | |
| KR | 2014027636 A | * | 3/2014 | ............... G03F 1/38 |
| KR | 10-2015-0132023 A | | 11/2015 | |
| TW | I375859 | * | 11/2012 | |
| TW | 201527866 A | * | 7/2015 | ............... G03F 1/26 |
| TW | 201543143 A | | 11/2015 | |
| WO | WO-2013172515 A1 | * | 11/2013 | ............... G03F 1/26 |

* cited by examiner

LITHOGRAPHY MASK AND METHODS

PRIORITY CLAIM AND CROSS-REFERENCE

This application claims the benefit of U.S. Provisional Patent Application No. 63/197,651, filed Jun. 7, 2021, which is incorporated by reference herein in its entirety.

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
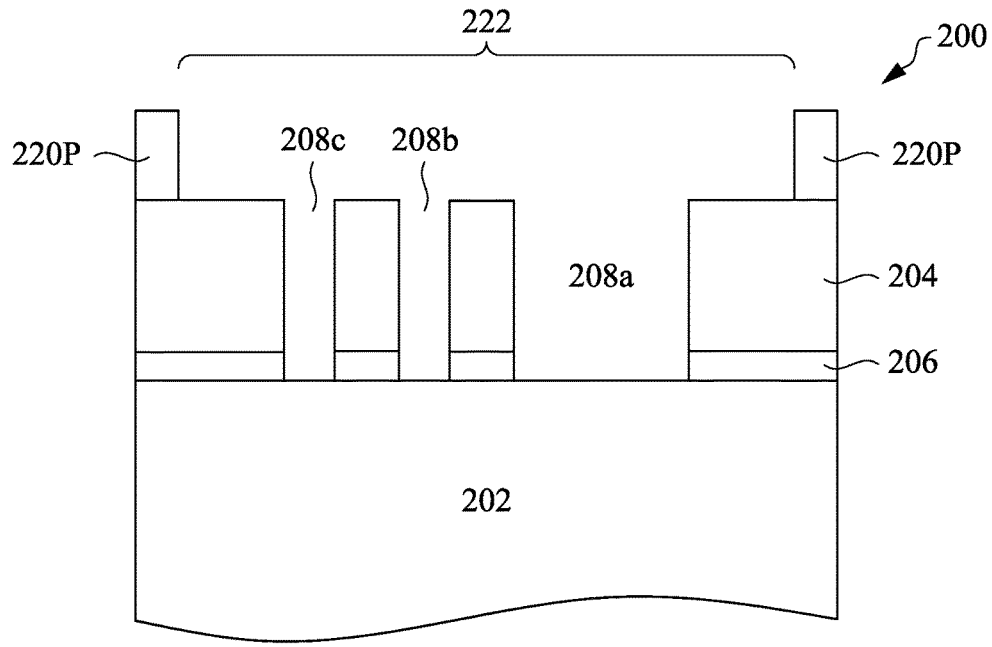
FIGS. 1A and 1B are cross-sectional views of two embodiments of lithography mask, in accordance with two embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as photolithography masks or masks). The photomasks are used to transfer the design of each layer of the ICs onto a semiconductor substrate during the semiconductor device fabrication process.

With the shrinkage in IC size, various types of this lithography techniques such as immersion lithography utilizing wavelengths on the order of 193 nm from an ArF laser or extreme ultraviolet (EUV) light with a wavelength of 13.5 nm is employed in, for example, a lithographic process to enable transfer of very small patterns (e.g., nanometer-scale patterns) from a mask to a semiconductor wafer.

An ongoing desire to have more densely packed integrated devices has resulted in changes to the photolithography process in order to form smaller individual feature sizes. The minimum feature size or "critical dimension" (CD) obtainable by a process is determined approximately by the formula $CD = k_1 * \lambda / NA$, where $k_1$ is a process-specific coefficient, $\lambda$ is the wavelength of applied light/energy, and NA is the numerical aperture of the optical lens as seen from the substrate or wafer.

For fabrication of dense features with a given value of $k_1$, the ability to project a usable image of a small feature onto a wafer is limited by the wavelength $\lambda$ and the ability of the projection optics to capture enough diffraction orders from an illuminated mask. When either dense features or isolated features are made from a photomask or a reticle of a certain size and/or shape, the transitions between light and dark at the edges of the projected image may not be sufficiently sharply defined to correctly form target photoresist patterns. This may result, among other things, in reducing the contrast of aerial images and also the quality of resulting photoresist profiles. As a result, features 150 nm or below in size may need to utilize phase shifting masks (PSMs) or techniques to enhance the image quality at the wafer, e.g., sharpening edges of features to improve resist profiles.

Phase-shifting generally involves selectively changing phases of part of the energy passing through a photomask/reticle so that the phase-shifted energy is additive or subtractive with energy that is not phase-shifted at the surface of the material on the wafer that is to be exposed and patterned. By carefully controlling the shape, location, and phase shift angle of mask features, the resulting photoresist patterns can have more precisely defined edges. As the feature size reduces, an imbalance of transmission intensity between the 0° and 180° phase portions and a phase shift that varies from 180° can result in significant critical dimension (CD) variation and placement errors for the photoresist pattern.

Phase shifts may be obtained in a number of ways. For example, one process known as attenuated phase shifting (AttPSM) utilizes a mask that includes a layer of non-opaque material that causes light passing through the non-opaque material to change in phase compared to light passing through transparent parts of the mask. In addition, the non-opaque material can adjust the amount (intensity/magnitude) of light transmitted through the non-opaque material compared to the amount of light transmitted through transparent portions of the mask.

Another technique is known as alternating phase shift, where the transparent mask material (e.g., quartz or $SiO_2$ substrate) is sized (e.g., etched) to have regions of different depths or thicknesses. The depths are selected to cause a desired relative phase difference in light passing through the regions of different depths/thicknesses. The resulting mask is referred to as an "alternating phase shift mask" or "alternating phase shifting mask" (AltPSM). AttPSM and AltPSMs are referred to herein as "APSM." The portion of the AltPSM having the thicker depth is referred to as the 0° phase portion, while the portion of the AltPSM having the lesser depth is referred to as the 180° phase portion. The depth difference allows the light to travel half of the wavelength in the transparent material, generating a phase difference of 180° between 0° and 180° portions. In some implementations, a patterned phase shifting material is located above the portions of the transparent mask substrate that has not been etched to different depths. The phase shifting material is a material that affects the phase of the light passing through the phase shifting material such that the phase of the light passing through the phase shifting material is shifted relative to the phase of the light that does not pass through the phase shifting material, e.g., passes only through the transparent mask substrate material without passing through the phase shifting material. The phase shifting material can also reduce the amount of light transmitted through the phase shifting material relative to the amount of incident light that passes through portions of the mask not covered by the phase shifting material.

During formation of the patterned phase shifting material, the transparent mask substrate upon which the phase shifting layer is formed may be exposed to materials which can etch the substrate. Unwanted etching of the substrate can alter the relative depths/thicknesses of portions of the mask substrate which can negatively affect the ability of the APSM mask to produce the desired phase shift. This unwanted etching can result in photomask induced imaging aberrations resulting in feature-size dependent focus and pattern placement shifts.

In embodiments of the present disclosure, APSM structures and methods of producing such APSM structures are described. APSM structures in accordance with embodiments described herein include an etch stop layer which protects the light transmitting substrate from materials used during the formation of the APSM that are capable of etching the substrate. The described methods utilize the etch stop layer to minimize or prevent etching of the underlying substrate, which could affect the phase shift in unwanted ways. In some embodiments, the etch stop layer is essentially transparent to the incident light, e.g., light used in immersion lithography techniques having a wavelength of about 194 nanometers, and in other embodiments the etch stop layer is less than transparent to the incident light.

FIG. 1A is a cross-sectional view of a lithography mask 200, e.g., an APSM, in accordance with an embodiment of the present disclosure. Referring to FIG. 1A, the APSM mask 200 includes a substrate 202 and a phase shift layer 204 over a front surface of the substrate 202. Between the phase shift layer 204 and substrate 202 is an etch stop layer 206. In the embodiment illustrated in FIG. 1A, portions of phase shift layer 204 and etch stop layer 206 are removed to provide openings 208a, 208b and 208c through which the upper surface of substrate 202 is exposed. In the embodiment of FIG. 1A, etch stop layer 206 has limited transparency to light which will be incident on the mask 200 during a lithography process. The APSM mask 200 includes image border features 220P around a periphery of an image region 222 of the APSM mask 200. In some embodiments, the phase shift material layer 204 and the semi transmissive etch stop layer 206 are etched such that portions of the phase shift material layer 204 and the semi transmissive etch stop layer 206 underlying the image border features 220P are separated from the balance of the phase shift material layer 204 and etch stop layer 206. In such embodiments, the portions of the phase shift material layer 204 and the semi transmissive etch stop layer 206 underlying the image border feature 220P are separated from the balance of the phase shift material layer 204 and the etch stop layer 206 by a trench (not shown).

Figure 1B:
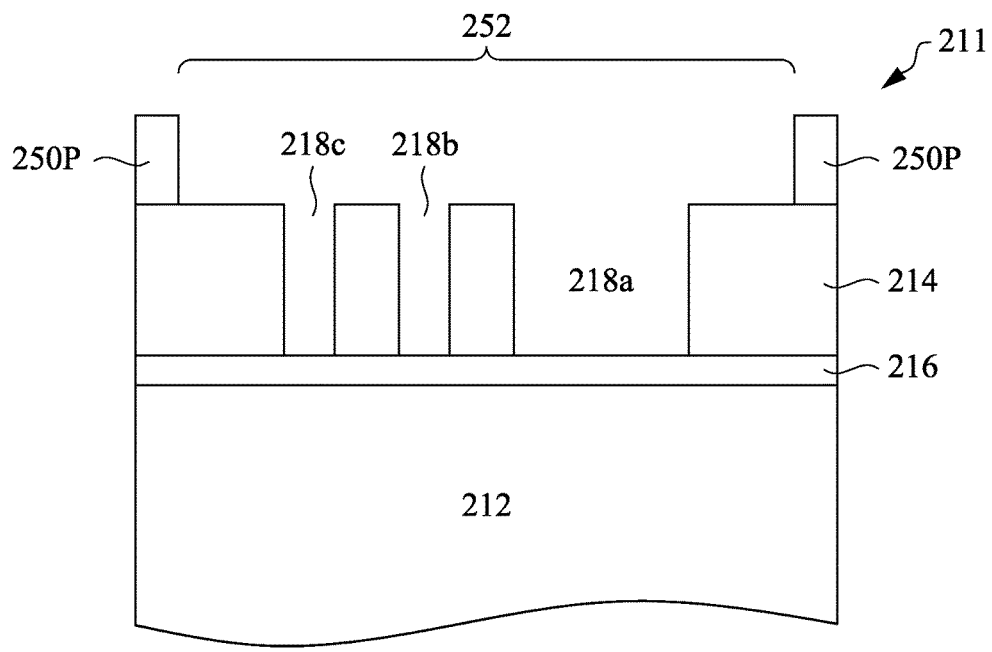

FIG. 1B is a cross-sectional view of an APSM 211, in accordance with another embodiment of the present disclosure. Referring to FIG. 1B, the APSM mask 211 includes a substrate 212 and a phase shift layer 214 over a front surface of the substrate 212. Underlying the phase shift layer 214 and overlying the substrate 212 is an etch stop layer 216. In the embodiment illustrated in FIG. 1B, portions of phase shift layer 214 are removed to provide openings 218a, 218b and 218c through which the upper surface of etch stop layer 216 is exposed. In the embodiment of FIG. 1B, etch stop layer 216 is essentially 100% transparent to incident light which will fall on the mask during a lithography process in which the mask is deployed. The APSM mask 211 includes image border features 250P around a periphery of an image region 252 of the APSM mask 211. Image border feature 250P is similar to the image border feature 220P described above with reference to FIG. 1A.

The image border features 220P and 250P correspond to a non-patterned region of the masks 200 and 211 in FIGS. 1A and 1B. The image border features 220P and 250P are not used in an exposing process during IC fabrication. In some embodiments, the image regions 222 and 252 of masks 200 and 211, respectively, in FIGS. 1A and 1B are located at central region of the substrates 202 and 212, and the image border features 220P and 250P are located at edge portions of the substrates 202 and 212, respectively.

Figure 4:
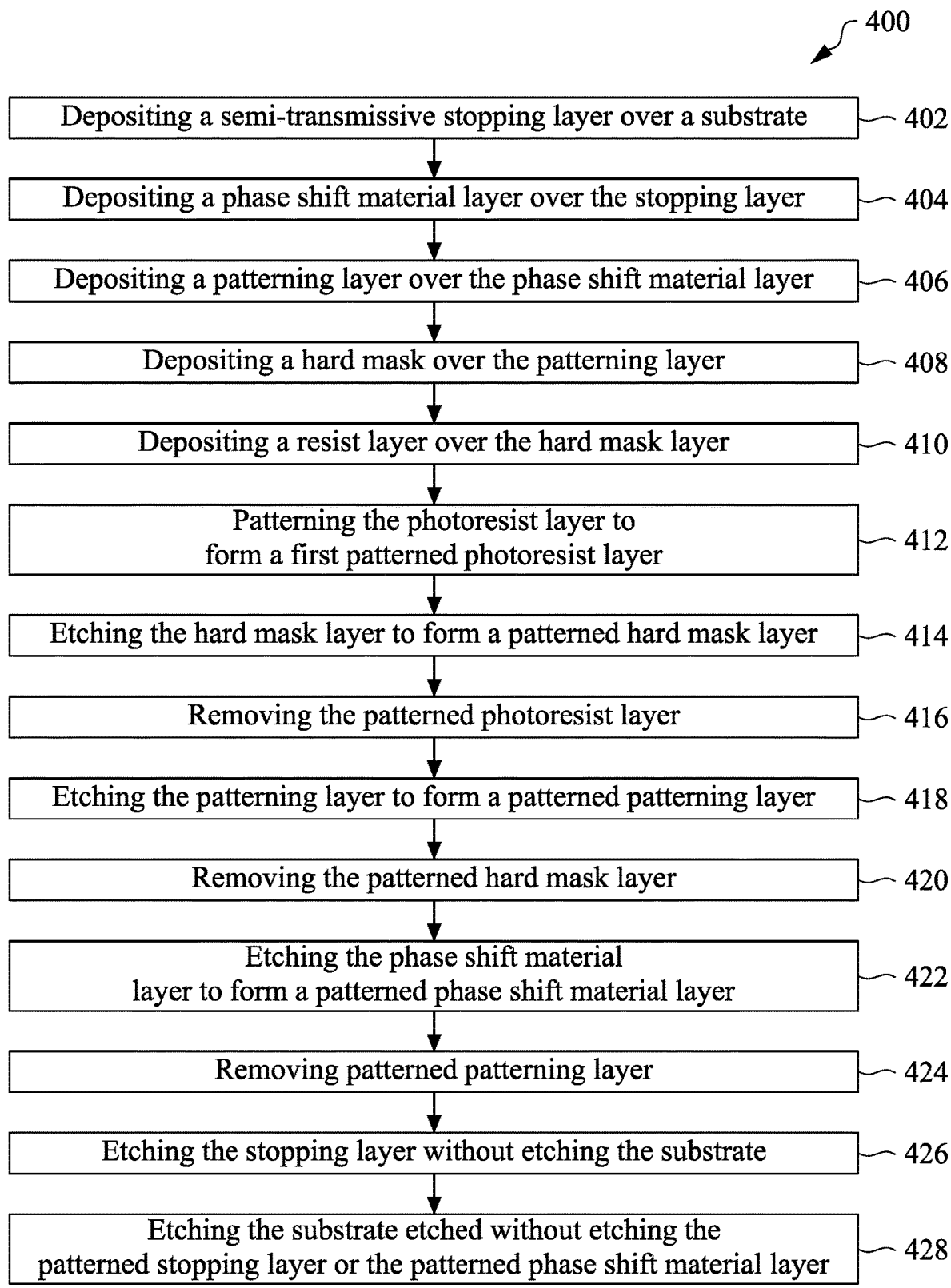
FIG. 4 is a flowchart of a method for fabricating the lithography mask of FIG. 1A, in accordance with some embodiments.

FIG. 4 is a flowchart of a method 400 for fabricating lithography mask, for example, an immersion lithography APSM mask 200 of FIG. 1A, in accordance with some embodiments. FIGS. 2A through 2E are cross-sectional views of the mask 200 at various stages of the fabrication process, in accordance with some embodiments. The method 400 is discussed in detail below, with reference to the mask 200 in FIGS. 2A-2E. In some embodiments, additional operations are performed before, during, and/or after the method 400, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 2A:
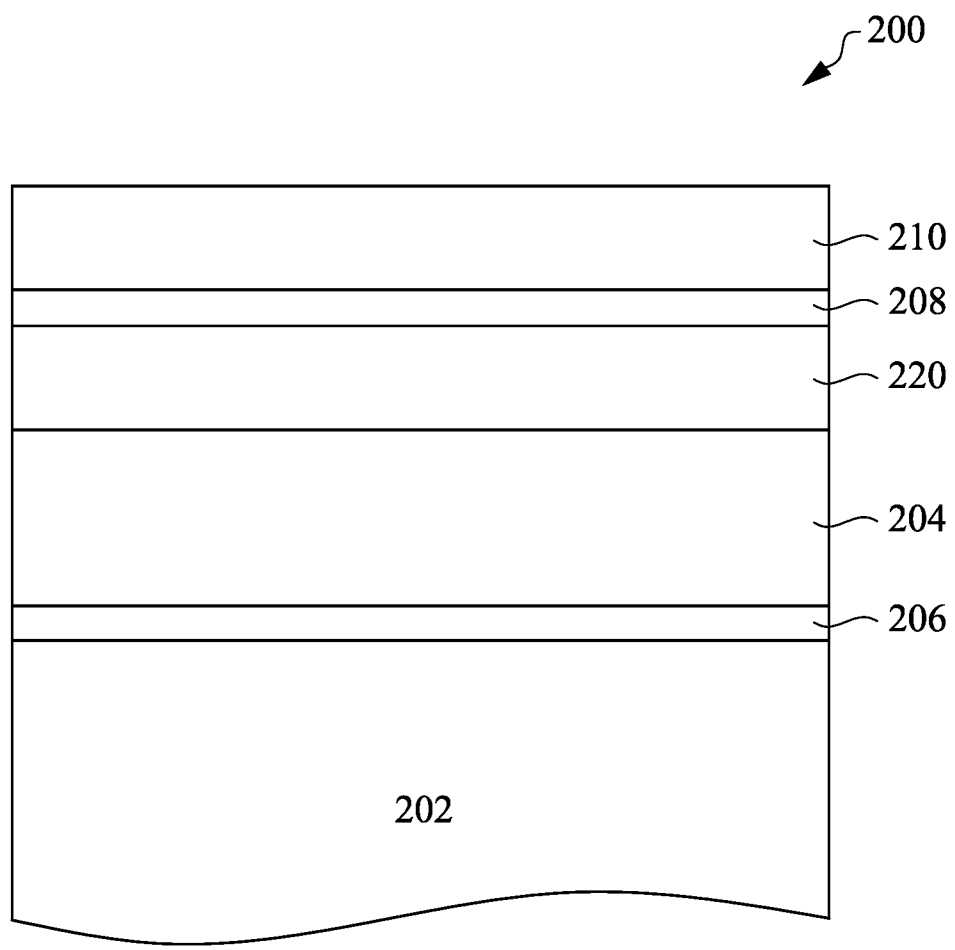
FIGS. 2A-2E are cross-sectional views of a lithography mask at various stages of the fabrication process of FIG. 4, in accordance with some embodiments.

Referring to FIGS. 4 and 2A, the method 400 includes operations 402, 404, 406, 408 and 410, in which a semi-transmissive etch stop layer 206, a phase shift material layer 204, a patterning layer 220, a hard mask layer 208 and a photoresist layer 210 are formed over a substrate 202, in accordance with some embodiments. FIG. 2A is a cross-sectional view of an intermediate structure of a mask 200 after operations 402, 404, 406, 408 and 410 of forming the semi-transmissive etch stop layer 206, a phase shift material layer 204, a patterning layer 220, a hard mask layer 208 and a photoresist layer 210 respectively over substrate 202 have been completed.

Referring to FIG. 2A, mask 200 includes a substrate 202 made of glass, silicon, quartz or other low thermal expansion materials. The low thermal expansion material helps to minimize image distortion due to mask heating during use of the mask 200. In some embodiments, the substrate 202 includes fused silica, fused quartz, calcium fluoride, silicon carbide, black diamond, or titanium oxide doped silicon oxide ($SiO_2/TiO_2$). In some embodiments, the substrate 202 has a thickness ranging from about 1 mm to about 7 mm. If the thickness of the substrate 202 is too small, a risk of breakage or warping of the mask 200 increases, in some instances. On the other hand, if the thickness of the substrate 202 is too great, a weight and cost of the mask 200 is needlessly increased, in some instances.

In operation 402 of FIG. 4, a semi-transmissive etch stop layer 206 is disposed over a front surface of the substrate 202. In some embodiments, the etch stop layer 206 is in direct contact with the front surface of the substrate 202. In some embodiments, the etch stop layer 206 is semi-transmissive to light energy used in photolithography processes. For example, in some embodiments, the etch stop layer is semi-transmissive to deep UV, near UV or light energy used in immersion lithography, light from an ArF excimer laser having a wavelength of about 193 nanometers. Semi-transmissive to light or radiation means that a material transmits less than 70% of light that is incident on a surface of the material. For example, in some embodiments, a semi-transmissive etch stop layer 206 transmits up to 70% of radiation incident on etch stop layer 206. In other embodiments, etch stop layer transmits up to 60% of radiation incident on etch stop layer 206. In some embodiments, etch stop layer transmits up to 50% of radiation incident on etch stop layer 206. In other embodiments, etch stop layer transmits up to 40% of radiation incident on etch stop layer 206. In some embodiments, etch stop layer transmits up to 30% of radiation incident on etch stop layer 206.

Examples of materials useful as etch stop layer 206 include materials that are resistant to etching by materials used to etch the material of the phase shift layer 204 described below. In embodiments where the phase shift layer 204 is formed of a MoSi compound, fluorine containing etchants are used to etch phase shift layer 204. In accordance with embodiments of the present disclosure, the material of the etch stop layer 206 are resistant to etching by fluorine containing etchants. Examples of fluorine containing etchants useful in the removal of portions of phase shift layer 204 include fluorine containing gases such as $CF_4$, $CHF_3$, $C_2F_6$, $CH_2F_2$, $SF_6$ or combinations thereof. Materials that are resistant to etching by fluorine-containing etchants and that are useful as an etch stop layer 206 include CrON, Ru and composites of Ru such as Ru—Nb, Ru—Zr, Ru—Ti, Ru—Y, Ru—B, Ru—P and the like. Embodiments in accordance with the present disclosure are not limited to etch stop layers of these specific materials. Other materials that are semi-transmissive to the incident light and are resistant to etching by fluorine containing etchants described above can be used as an etch stop layer in accordance with embodiments described herein. In other embodiments, materials that are semi-transmissive to the incident light and resistant to etching by etchants other than fluorine containing etchants that may be used to etch phase shift layer 204 can be utilized.

In some embodiments, the etch stop layer 206 can be etched with chlorine containing etchants. An advantage of utilizing an etch stop layer 206 that can be etched with chlorine containing etchants is that materials used as substrate 202, such as quartz, are not etched by chlorine containing etchants. Examples of chlorine containing etchants include a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof).

In some embodiments, etch stop layer 206 has a thickness of between about 1 to 20 nm. In other embodiments, etch stop layer 206 has a thickness between about 1 to 10 nm. Embodiments in accordance with the present disclosure are not limited to etch stop layers having a thickness between 1 to 20 nm or between 1 to 10 nm. For example, in some embodiments, the etch stop layer 206 may be thinner than 1 nm or may be thicker than 20 nm.

The etch stop layer 206 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 404, a phase shift material layer 204 is disposed over a front surface of the substrate 202. In some embodiments, the phase shift material layer 204 is in direct contact with the front surface of the etch stop layer 206 on substrate 202. The phase shift material layer 204 produces a phase shift in light that is incident on and transmitted through the phase shift material layer 204. In accordance with embodiments of the present disclosure, the degree of the phase shift produced in the light that enters the phase shift material 204 and passes through the phase shift material 204 and the patterned etch stop layer 206 compared to the phase of the incident light that does not pass through the phase shift material layer 204 or the etch stop layer 206 can be adjusted by changes in the refractive index and thickness of the phase shift material layer 204 and/or the refractive index and thickness of the etch stop layer 206. In some embodiments, the refractive index and thickness of the phase shift material layer 204 and the etch stop layer 206 are chosen so that the phase shift produced in the light that enters the phase shift material layer 204 and passes through the phase shift material 204 and the patterned etch stop layer 206 is about 180 degrees. Embodiments in accordance with the present disclosure are not limited to producing a 180° phase shift. For example, in other embodiments, the desired phase shift may be greater than or less than 180°.

In some embodiments, the transmission of incident light that enters the phase shift material 204 and passes through the phase shift material 204 and the patterned etch stop layer 206 compared to the transmission of the incident light that does not pass through the phase shift material layer 204 or the etch stop layer 206 can be adjusted by changes in the absorption coefficient of the phase shift material layer 204 and/or the etch stop layer 206.

The refractive index and thickness of the phase shift material layer 204 can be adjusted alone or in combination with the refractive index and the thickness of the etch stop layer 206 in order to provide the desired phase shift. The refractive index of the phase shift material layer 204 can be adjusted by altering the composition of the material of the phase shift material layer 204. For example, the ratio of Mo to Si in MoSi compounds can be varied to adjust the refractive index of the phase shift material layer 204. Doping the phase shift material layer 204 with elements such as B, C, O, N, Al and the like will adjust the index of refraction of the phase shift material layer 204.

In accordance with embodiments of the present disclosure, the transmission of incident light by the phase shift material layer 204 can be adjusted by adjusting the incident light absorption coefficient of the phase shift material layer 204. For example, increasing the EUV absorption coefficient of the phase shift material layer 204 will decrease the transmission of incident light through the phase shift material layer 204. Decreasing the absorption coefficient of the phase shift material layer 204 will increase the transmission of incident light through the phase shift material layer 204. The absorption coefficient of the phase shift material layer 204 can be adjusted by altering the composition of the material of the phase shift material layer 204. For example, the ratio of Mo to Si in MoSi compounds can be varied to adjust the absorption coefficient of the phase shift material layer 204. Doping the phase shift material layer 204 with elements such as B, C, O, N, Al, Ge, Sn, Ta and the like will adjust the absorption coefficient of the phase shift material layer 204.

In accordance with some embodiments, the thickness of the phase shift layer 204 can be altered based on the degree of phase shift desired. For example, making the phase shift layer thicker may increase or decrease the phase shift. In other examples, making the phase shift layer thinner may increase or decrease the phase shift. In some embodiments, the phase shift layer 204 has a thickness between about 30 and 100 nanometers. It is understood that embodiments in accordance with the present disclosure are not limited to phase shift layer 204 having a thickness between about 30 and 100 nm. In other embodiments, the phase shift layer 204 has a thickness less than 30 nm or greater than 100 nm.

Materials useful as the phase shift layer 204 include MoSi compounds and the like. For example, phase shift layer 204 includes MoSi compounds such as MoSi, MoSiCON, MOSiON, MoSiCN, MoSiCO, MoSiO, MoSiC and MoSiN. Embodiments in accordance with the present disclosure are not limited to phase shift layers utilizing the foregoing MoSi compounds. In other embodiments, phase shift layer 204 includes compounds other than MoSi compounds that are capable of shifting the phase of light incident on the phase shift layer, e.g., for example, by 180 degrees.

The phase shift layer 204 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 406, a patterning layer 220 is deposited over the phase shift material layer 204. In some embodiments, the patterning layer 220 is patterned and utilized as a mask for patterning the phase shift material layer 204. In addition, as noted above, peripheral portions of the patterning layer 220 are patterned to form image border features 220P around a periphery of an image region 222 of the APSM mask 200.

In some embodiment, the patterning layer 220 includes metals, metal oxides, or other suitable materials. For example, the patterning layer 220 may include a tantalum-containing material (for example, Ta, TaN, TaNH, TaHF, TaHfN, TaBSi, TaB SiN, TaB, TaBN, TaSi, TaSiN, TaGe, TaGeN, TaZr, TaZrN, other tantalum-containing material, or combinations thereof), a chromium-containing material (for example, Cr, CrN, CrO, CrC, CrON, CrCN, CrOC, CrOCN, other chromium-containing material, or combinations thereof), a titanium-containing material (for example, Ti, TiN, other titanium-containing material, or combinations thereof), other suitable material, or combinations thereof. The material of the patterning layer 220 is not limited herein and may include other materials that are able to block incident light (for purposes of providing image border features 220P with light blocking characteristics) and exhibit selective etching or removal characteristics relative to the phase shift material layer 204 and hard mask layer 208 described below.

In some embodiments of the present disclosure, the patterning layer 220 is 5 to 50 nm thick. The patterning layer 220 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 408, hard mask layer 208 is formed over patterning layer 220. As described below in more detail, hard mask layer 208 will be patterned and the pattern of hard mask layer 208 will be transferred to patterning layer 220. In some embodiments, the hard mask layer 208 includes a material that protects the patterning layer 220 of the mask 200. In some embodiments, the materials of the hard mask layer 208 and the patterning layer 220 have similar properties relative to materials used to remove the photoresist layer 210 described below and different properties relative to materials used to etch the hard mask layer 208. In some embodiments, the hard mask layer 208 includes a chromium-containing material, such as Cr, CrN, CrO, CrC, CrON, CrCN, CrOC, CrOCN, other chromium-containing material, or combinations thereof. When the hard mask layer 208 is selected from these chromium-containing materials, the material chosen for the patterning layer 220 is a material that can be selectively etched relative to the material of the hard mask layer 208. For example, when the hard mask layer is a chromium-containing material, the patterning layer 220 is not a chromium-containing material. In some alternative embodiments, the hard mask layer 208 includes a tantalum-containing material, such as Ta, TaN, TaNH, TaHF, TaHfN, TaBSi, TaB SiN, TaB, TaBN, TaSi, TaSiN, TaGe, TaGeN, TaZr, TaZrN, other tantalum-containing material, or combinations thereof which can be etched with a fluorine-containing etchant.

In some embodiments, the hard mask layer 208 has a thickness of about 3.5 nm to about 5 nm. The hard mask layer 208 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 410, a photoresist layer 210 is deposited over the hard mask layer 208. Photoresist layer 210 is patterned as described below in more detail and the patterned photoresist is used as a mask to pattern the underlying hard mask layer 208. In some embodiments, the pattern of the photoresist layer 210 will be transferred onto the phase shift material layer 204 in subsequent processes. In some embodiments, the photoresist layer 210 may be a chemically amplified resist that employs acid catalysis. For example, the photoresist of the photoresist layer 210 may be formulated by dissolving an acid sensitive polymer in a casting solution. In some embodiments, the photoresist of the photoresist layer 210 may be a positive tone photoresist which would render the patterns subsequently formed having the same contour as the patterns on a mask (not illustrated). In some alternative embodiments, the photoresist of the photoresist layer 210 may be a negative tone photoresist which would render the patterns subsequently formed having openings corresponding to the patterns on the mask (not illustrated). The photoresist layer 210 may be formed by spin coating or other similar techniques.

Figure 2B:
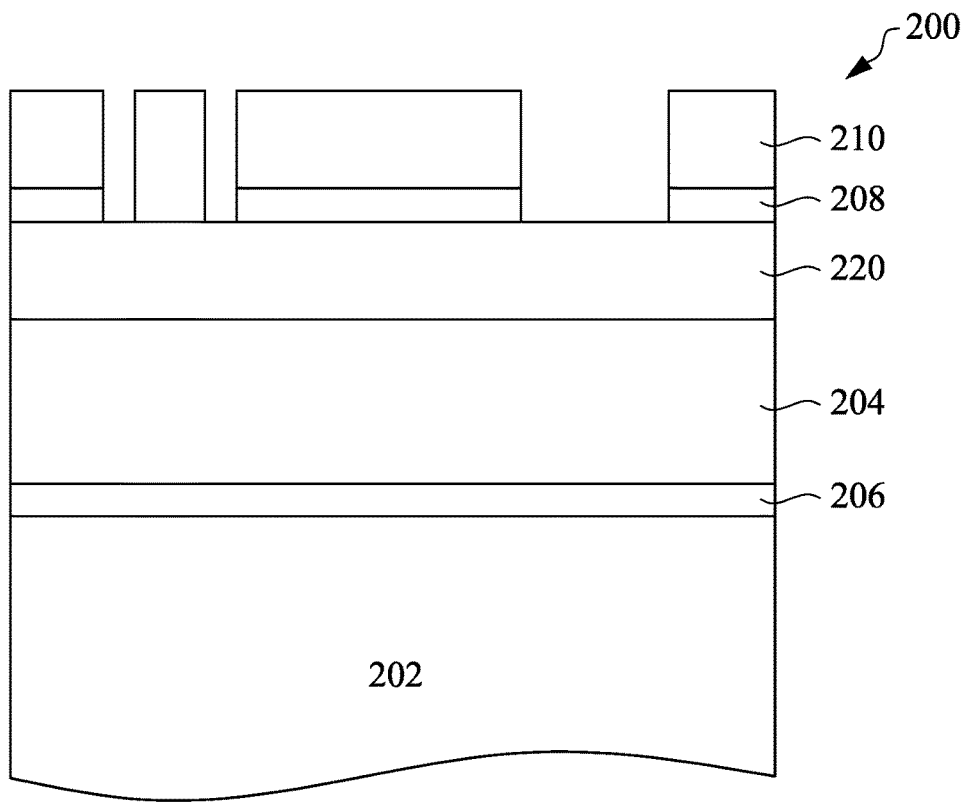

Referring to FIG. 2B, an intermediate structure of mask 200 after patterning of photoresist layer 210 and hard mask 208 is illustrated. Referring additionally to FIG. 4, at operation 412, the photoresist layer 210 is patterned by performing an exposure process on the photoresist layer 210. The exposure process may include a lithography technique with a mask (for instance, a photolithography process) or a mask-less lithography technique (for instance, an electron-beam (e-beam) exposure process or an ion-beam exposure process). After the exposure process, a post-baking process may be performed to harden at least a portion of the photoresist layer 210. Depending on the material(s) or type(s) of the photoresist layer 210, polymers of the photoresist layer may undergo different reactions (chain scission or cross-linking of polymers) upon the irradiation of the light beam and baking. Thereafter, a development process is performed to remove at least a portion of the photoresist layer 210. In some embodiments, portions of the positive resist material exposed to the light beam may undergo chain scission reaction, resulting the exposed portions to be easily removed by a development agent as compared to other portions not exposed to the light beam. On the other hand, portions of the negative resist material exposed to the light beam may undergo the cross-linking reaction, resulting in the exposed portions being harder to remove by a development agent as compared to other portions not exposed to the light beam. In some embodiments, after development of the photoresist layer 210, portions of the underlying hard mask layer 208 are exposed.

Continuing to refer to FIG. 2B, after development of photoresist layer 210 is complete, at operation 414, hard mask layer 208 is etched through the openings in the developed photoresist layer 210. The hard mask layer 208 is patterned by etching the exposed portions of the hard mask layer 208 through the openings in the developed photoresist layer 210. The etching process can include a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters so as to be selective for the material of the hard mask layer 208 relative to other materials that will be exposed to the etchant during the etching of hard mask layer 208. In some embodiments, fluorine containing etchants are used in the removal of portions of hard mask layer 208. Examples of fluorine containing etchants include fluorine containing gases such as $CF_4$, $CHF_3$, $C_2F_6$, $CH_2F_2$, $SF_6$ or combinations thereof.

At operation 416, the patterned photoresist layer 210 is removed to expose the portions of the hard mask 208 that remain. The patterned photoresist layer 210 can be removed by wet stripping or plasma ashing. At operation 418, the pattern in hard mask layer 208 is transferred to the patterning layer 220 by etching patterning layer 220 through the openings in the hard mask layer 208. Etching of the patterning layer 220 is carried out by exposing the patterning layer 220 to etchants that are selective for the materials of the patterning layer 220 compared to other materials that will be exposed to the etching material during the step of etching the patterning layer 220. The etching process can include a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters so as to be selective for the material of the patterning layer 220 relative to other materials that will be exposed to the etchant during the etching of patterning layer 220, such as the patterned hard mask layer 208. In some embodiments, the etching process of the patterning layer 220 uses a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof). After patterning of the patterning layer 220 is complete, the patterned hard mask layer 208 is removed at operation 420, for example, using oxygen plasma or a wet etch.

Figure 2C:
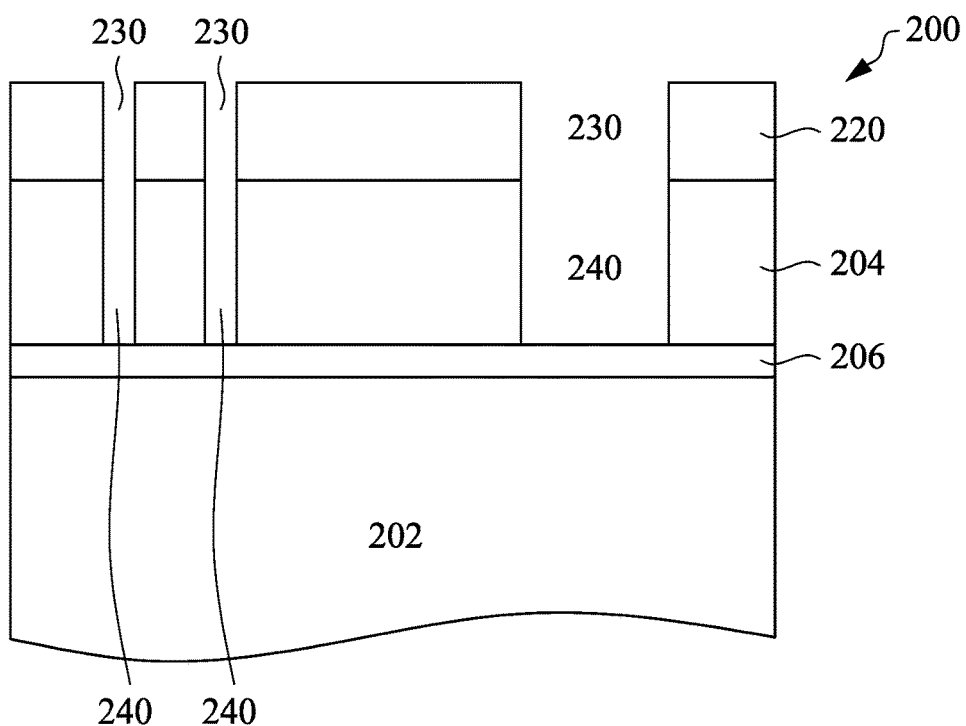

Referring to FIG. 2C, an intermediate structure of mask 200 after phase shift material layer 204 has been patterned through patterned patterning layer 220 is illustrated. In FIG. 2C, the patterned photoresist layer 210 and patterned hard mask layer 208 have been removed as described above. Referring to FIG. 4, in operation 422, the pattern of the patterned patterning layer 220 is transferred to the phase shift material layer 204 by etching phase shift material layer 204 through the openings 230 in patterning layer 220. Patterning of phase shift material layer 204 exposes portions of stopping layer 206 through openings 240 in phase shift material layer 204. Etching of phase shift material layer 204 is accomplished by exposing portions of the phase shift material layer 204 exposed through openings 230 in patterning layer 220 to an etchant that is selective for the material of the phase shift material layer 204 relative to the material of the patterning layer 220 and the material of the stopping layer 206. The etching process can include a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters so as to be selective for the material of the phase shift material layer 204 relative to other materials that will be exposed to the etchant during the etching of phase shifting material layer 204, such as the patterned patterning layer 220 and the stopping layer 206. In some embodiments, fluorine containing etchants are used in the removal of portions of phase shift layer 204. Examples of fluorine containing etchants include fluorine containing gases such as $CF_4$, $CHF_3$, $C_2F_6$, $CH_2F_2$, $SF_6$ or combinations thereof. After transfer of the pattern of the patterning layer 220 to the phase shift material layer 204 is complete, the patterned patterning layer 220 is removed at operation 424. In other embodiments as described below, removal of the patterned patterning layer 220 is carried out in operation 426 at the same time that etch stop layer 206 is patterned by etching.

Figure 2D:
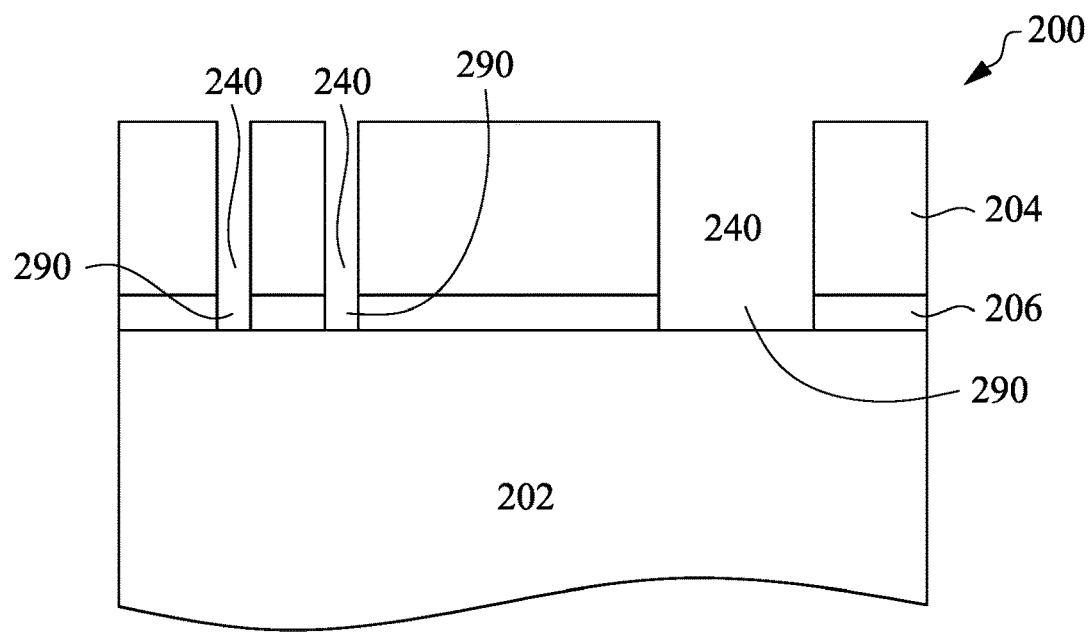

At operation 426, the pattern of phase shift material layer 204 is transferred to etch stop layer 206. The transfer of the pattern of phase shift material layer 204 is achieved by etching of etch stop layer 206 through openings 240 in phase shift material layer 204. In some embodiments, the etching of etch stop layer 206 uses a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof). In other embodiments, etch stop layer 206 can be etched using an etchant other than a chlorine-containing gas and an oxygen-containing gas. For example, etch stop layer 206 can be etched using an etchant that is selective for material of etch stop layer 206 relative to the material of phase shift material layer 204 and selective for the material of etch stop layer 206 relative to the material of the substrate 202. In accordance with some embodiments, when patterning layer 220 and etch stop layer 206 have a similar selectivity with respect to etchants, patterned patterning layer 220 can be removed in the same step that etch stop layer 206 is patterned. For example, when patterning etch stop layer 206 utilizing a chlorine-containing etchant, patterned patterning layer 220 can be removed by exposure to the chlorine-containing etchant. FIG. 2D illustrates a mask 200 in accordance with an embodiment of the present disclosure after etching of etch stop layer 206 is complete and optionally after patterned patterning layer 250 is removed in step 426. Mask 200 includes openings 290 in etch stop layer 206, through which portions of substrate 202 are exposed. In accordance with embodiments of the present disclosure, etching of the substrate 202 does not occur during operation 426 because the etchant used to pattern etch stop layer 206 is selective for etch stop layer 206 and does not etch substrate 202. Etching of substrate 202 is undesirable as such etching can alter the depth or thickness of substrate 202 potentially resulting in an unwanted or unpredictable phase shift of incident light.

Figure 2E:
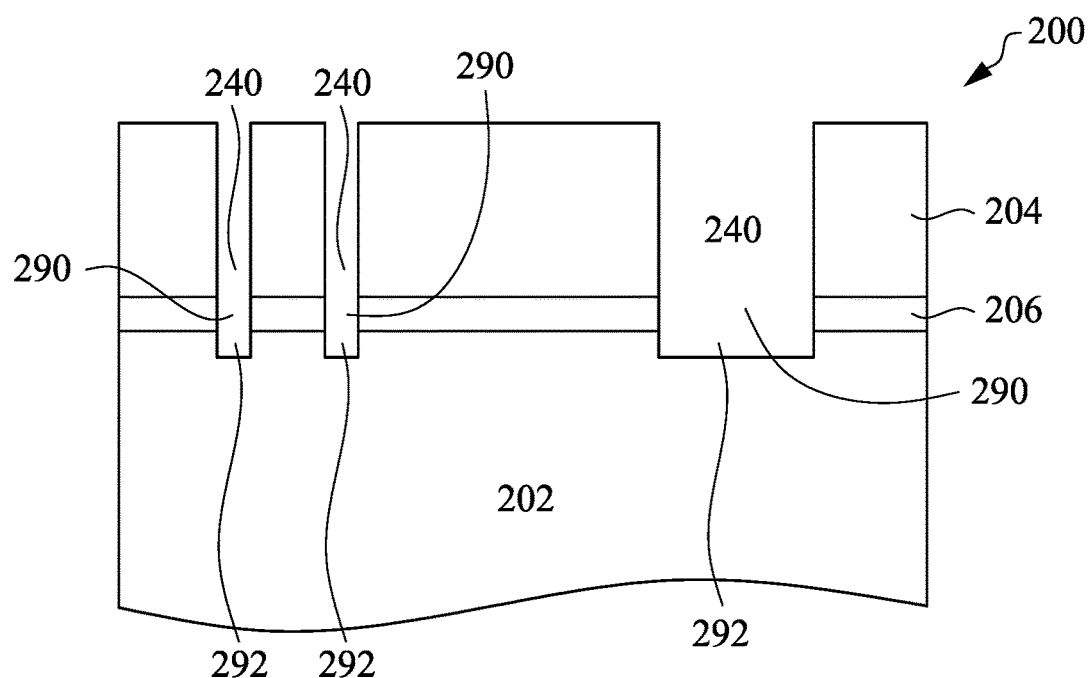

In accordance with some embodiments of the present disclosure, referring to FIGS. 4 and 2E, at operation 428, After the etch stop layer has been etched in operation 426, in some embodiments, the substrate 202 is etched without etching or removing portions of the patterned stopping layer 206 or the patterned phase shift material layer 204. In accordance with such embodiments, etching of the substrate 202 removes portions 292 of substrate 202 and is accomplished by exposing portions of substrate 202 exposed through openings 290 in etch stop layer 206 to an etchant. Substrate 202 is etched with an etchant that is selective for substrate 202 and which does not remove etch stop layer 206 or remove patterned phase shift material layer 204. Etching substrate 202 after etching of etch stopping layer 206 has been completed, provides an opportunity to more carefully control the etching of substrate 202 so that unwanted shifts in phase or transmission intensity due to over etching or under etching of substrate 202 are avoided or reduced.

After etching of the etch stop layer 206 is completed, or after substrate 202 has been etched in accordance with some embodiments, the lithography mask 200 is cleaned to remove any contaminants therefrom. In some embodiments, the mask 200 is cleaned by submerging the mask 200 into an ammonium hydroxide ($NH_4OH$) solution.

The mask 200 is subsequently radiated with, for example, an UV light with a wavelength of 193 nm, for inspection of any defects in the patterned region 222. The foreign matters may be detected from diffusely reflected light. If defects are detected, the mask 200 is further cleaned using suitable cleaning processes.

A mask 200 useful in a semiconductor lithography process is thus formed. The mask 200 includes a substrate 202, a patterned semi-transmissive etch stop layer 206 over the substrate and a patterned phase shift material layer 204 over the patterned semi-transmissive etch stop layer 206. According to this embodiment, the etch stop layer 206 has protected the underlying substrate 202 from etchants used during the mask formation process that would otherwise etch the substrate. As noted above, the thickness of the phase shift material layer 204, its index of refraction and incident light absorption characteristics, as well as the thickness of the etch stop layer 206, its index of refraction and incident light absorption characteristics, are chosen to provide a desired phase shift of the light incident on mask 200, e.g., 180 degrees and the amount of incident light transmitted through the phase shift material layer 204 and semi-transmissive etch stop layer 206. In addition, the amount of phase shift imparted to light passing through mask 200 can also be adjusted by adjusting the incident angle of light on the mask 200. As a result, a pattern on the mask 200 can be projected precisely onto a silicon wafer to produce precise and reproducible patterns. In embodiments where the substrate 202 has been etched as illustrated in FIG. 2E, the effect on the phase shift of light passing through the patterned portions of substrate 202 and the effect on the magnitude of light transmitted through the patterned portions of substrate 202 are taken into account when optimizing the thickness of the phase shift material layer 204, its index of refraction and incident light absorption characteristics, as well as the thickness of the etch stop layer 206, its index of refraction and incident light absorption characteristics.

FIG. 1B is a cross-sectional view of an APSM mask 211, in accordance with a second embodiment of the present disclosure. The APSM mask 211 includes a substrate 212 and a phase shift layer 214 over a front surface of the substrate 212. Underlying the phase shift layer 214 and overlying the substrate 212 is an etch stop layer 216. In the embodiment illustrated in FIG. 1B, portions of phase shift layer 214 are removed to provide openings 218a, 218b and 218c through which portions of the upper surface of etch stop layer 216 are exposed. In the embodiment of FIG. 1B, etch stop layer 216 is essentially 100% transparent to incident light, DUV, NUV or light used in immersion lithography, such as light from an ArF excimer laser having a wavelength of about 193 nanometers. Unlike the etch stop layer 206 of the embodiment described above with regard to FIG. 1A, the etch stop layer 216 of the embodiment of FIG. 1B does not include the pattern of the overlying phase shift material layer 214. Similar to the APSM mask 200, the APSM mask 211 of FIG. 1B includes image border features 250P around a periphery of an image region 252 of the APSM mask 211. As in FIG. 1B, the image border features 250P correspond to a non-patterned region of the mask 211 in FIG. 1B. The image border features 250P are not used in an exposing process during IC fabrication. In some embodiments, the image region 252 of mask 211 in FIG. 1B is located at a central region of the substrate 212, and the image border features 250P are located at an edge portion of the substrate 212. In some embodiments, the phase shift material layer 214 and the transmissive etch stop layer 216 are etched such that portions of the phase shift material layer 214 and the transmissive etch stop layer 216 underlying the image border features 250P are separated from the balance of the phase shift material layer 214 and etch stop layer 216. In such embodiments, the portions of the phase shift material layer 214 and the semi transmissive etch stop layer 216 underlying the image border feature 250P are separated from the balance of the phase shift material layer 214 and the etch stop layer 216 by a trench (not shown).

Figure 5:
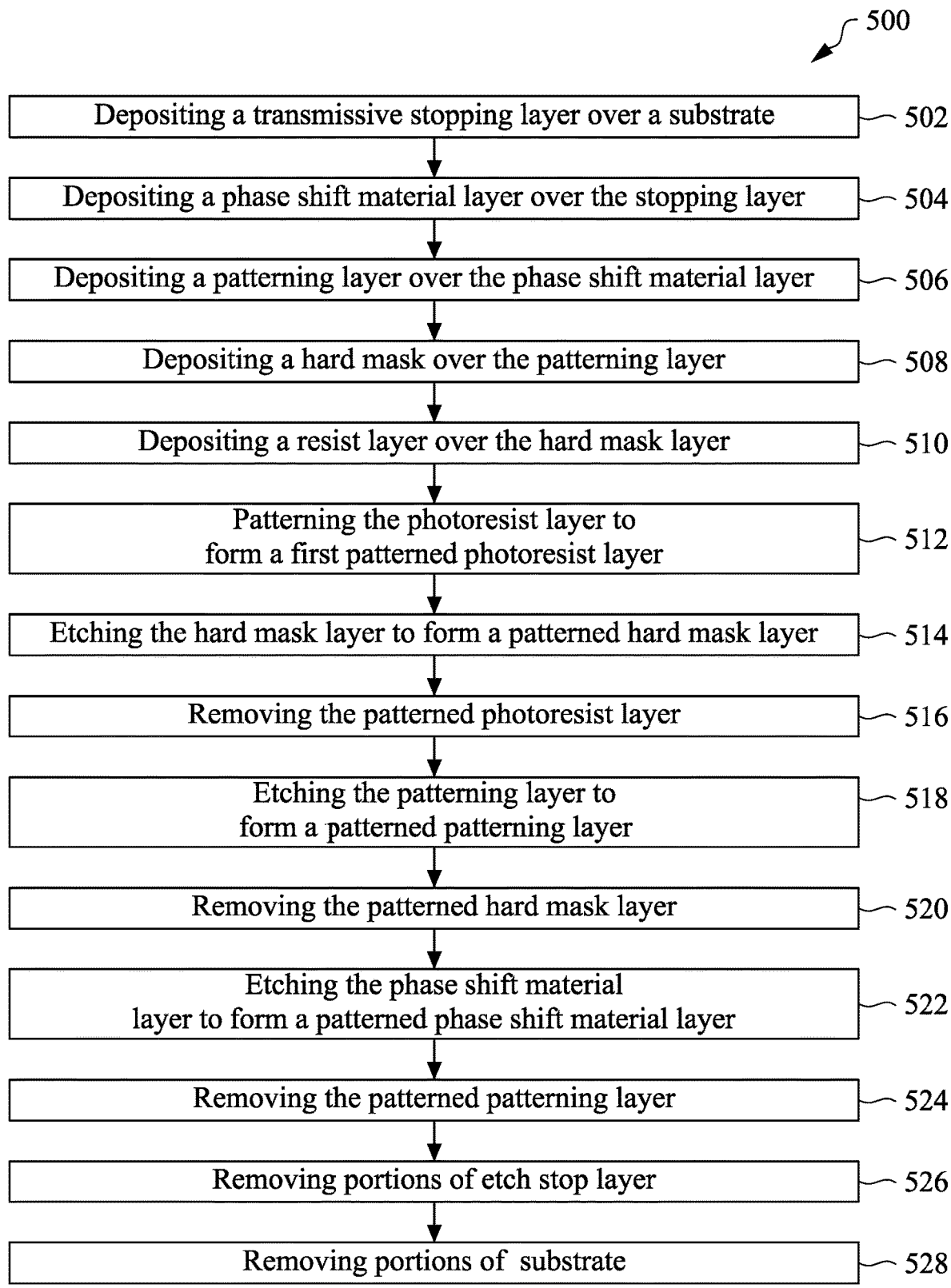
FIG. 5 is a flowchart of a method for fabricating the lithography mask of FIG. 1B, in accordance with some embodiments.

FIG. 5 is a flowchart of a method 500 for fabricating an mask, for example, an APSM mask 211, in accordance with some embodiments. FIG. 3A through FIG. 3E are cross-sectional views of the mask 211 at various stages of the fabrication process, in accordance with some embodiments. The method 500 is discussed in detail below, with reference to the mask 211 in FIGS. 3A-3E. In some embodiments, additional operations are performed before, during, and/or after the method 500, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 3A:
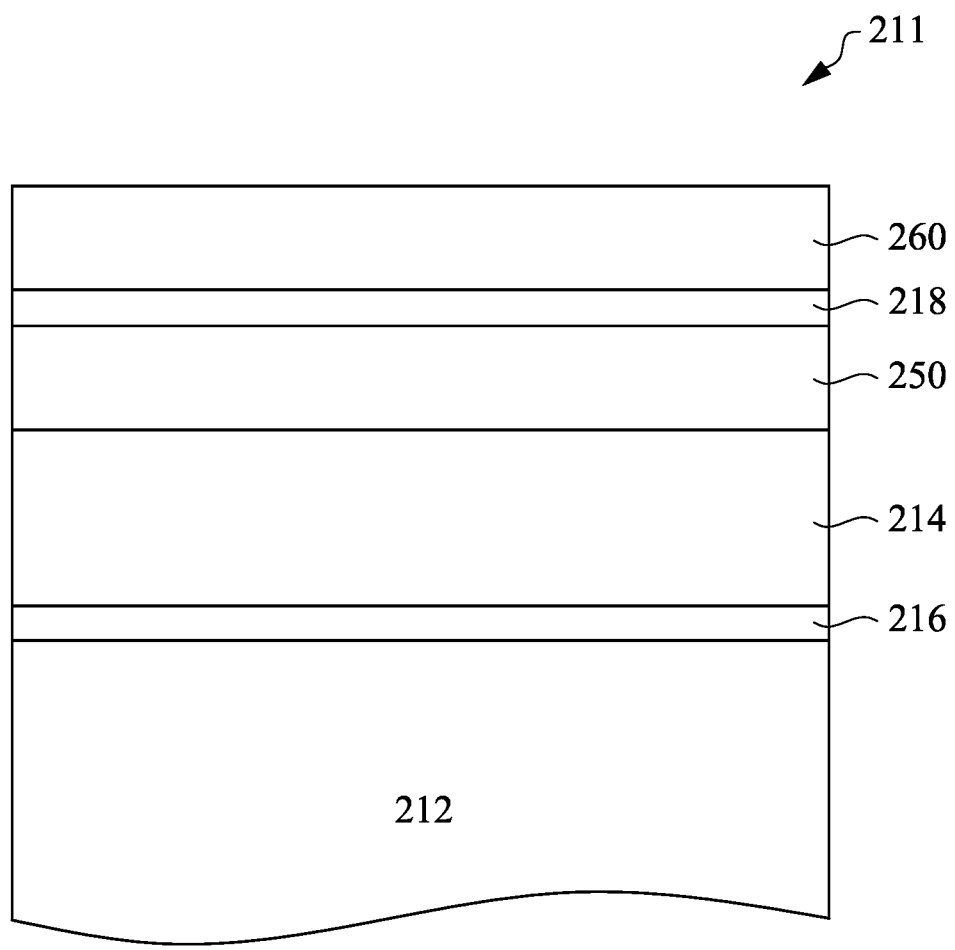
FIGS. 3A-3E are cross-sectional views of a lithography mask at various stages of the fabrication process of FIG. 5, in accordance with some embodiments.

Referring to FIGS. 5 and 3A, the method 500 includes operations 502, 504, 506, 508 and 510, in which a transmissive etch stop layer 216, a phase shift material layer 214, a patterning layer 250, a hard mask layer 218 and a photoresist layer 260 are formed over a substrate 212, in accordance with some embodiments. FIG. 3A is a cross-sectional view of an intermediate structure of a mask 211 after operations 502, 504, 506, 508 and 510 of forming the transmissive etch stop layer 216, a phase shift material layer 214, a patterning layer 250, a hard mask layer 218 and a photoresist layer 260 respectively over substrate 212 have been completed, in accordance with some embodiments.

Referring to FIG. 3A, the mask 211 includes a substrate 212 made of glass, silicon, quartz or other low thermal expansion materials. The low thermal expansion material helps to minimize image distortion due to mask heating during use of the mask 211. In some embodiments, the substrate 212 includes fused silica, fused quartz, calcium fluoride, silicon carbide, black diamond, or titanium oxide doped silicon oxide ($SiO_2/TiO_2$). In some embodiments, the substrate 212 has a thickness ranging from about 1 mm to about 7 mm. If the thickness of the substrate 212 is too small, a risk of breakage or warping of the mask 211 increases, in some instances. On the other hand, if the thickness of the substrate 212 is too great, a weight and cost of the mask 211 is needlessly increased, in some instances.

In operation 502 of FIG. 5, a transmissive etch stop layer 216 is disposed over a front surface of the substrate 212. In some embodiments, the etch stop layer 216 is in direct contact with the front surface of the substrate 212. In some embodiments, the etch stop layer 216 is transmissive to light energy used in photolithography processes. As used herein, a transmissive etch stop layer refers to an etch stop layer formed of materials that transmit over 70% of light incident on the material. For example, in some embodiments, the etch stop layer is transmissive to radiation used in immerision lithography processes. For example, in some embodiments, transmissive etch stop layer 216 transmits over 90% of radiation incident on transmissive etch stop layer 216. In other embodiments, transmissive etch stop layer 216 transmits over 95% of radiation incident on transmissive etch stop layer 216. In some embodiments, transmissive etch stop layer 216 transmits over 99% of radiation incident on transmissive etch stop layer 216, e.g., etch stop layer 216 transmits about 99.5% or more of radiation incident on transmissive etch stop layer 216.

Examples of materials useful as a transmissive etch stop layer 216 include materials that protect the underlying substrate 212 from etchants that are used to etch features that are separated from the substrate 212 by etch stop layer 216. For example, in embodiments where the phase shift layer 214 is formed of a MoSi compound, fluorine containing etchants are used to etch phase shift layer 214. In accordance with embodiments of the present disclosure, the material of the etch stop layer 216 are resistant to etching by fluorine containing etchants and are transmissive to the incident radiation. Examples of fluorine containing etchants useful in the removal of portions of phase shift layer 204 include fluorine containing gases such as $CF_4$, $CHF_3$, $C_2F_6$, $CH_2F_2$, $SF_6$ or combinations thereof. Materials that are resistant to etching by fluorine-containing etchants and are transmissive to incident radiation include $Al_xSi_yO_z$ ($x+y+z=1$). Embodiments in accordance with the present disclosure are not limited to etch stop layers of only $Al_xSi_yO_z$ ($x+y+z=1$). Other materials that are transmissive to incident radiation and are resistant to etching by fluorine containing etchants, or other etchants used to etch the phase shift material layer 214, can be used as an etch stop layer 216 in accordance with embodiments described herein. In other embodiments, the materials of etch stop layer 216 are resistant to etching by chlorine-containing etchants and are transmissive to EUV radiation. Examples of chlorine-containing etchants include chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof). Materials that are resistant to etching by chlorine-containing etchants and are transmissive to incident radiation include $Al_xSi_yO_z$ ($x+y+z=1$).

In some embodiments, etch stop layer 216 has a thickness of between about 1 to 20 nm. In other embodiments, etch stop layer 216 has a thickness between about 1 to 10 nm. Embodiments in accordance with the present disclosure are not limited to etch stop layers having a thickness between 1 to 20 nm or between 1 to 10 nm. For example, in some embodiments, the etch stop layer 216 may be thinner than 1 nm or may be thicker than 20 nm.

The etch stop layer 216 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 504, a phase shift material layer 214 is disposed over a front surface of the substrate 212. In some embodiments, the phase shift material layer 214 is in direct contact with the front surface of the etch stop layer 216 on substrate 202. The phase shift material layer 214 produces a phase shift in light that is incident on and transmitted through the phase shift material layer 214. In accordance with embodiments of the present disclosure, the degree of the phase shift produced in the light that enters the phase shift material layer 214 and passes through the phase shift material 214 compared to the phase of the incident light that does not pass through the phase shift material layer 214 can be adjusted by changes in the refractive index and thickness of the phase shift material layer 214. In some embodiments, the refractive index and thickness of the phase shift material layer 214 is chosen so that the phase shift produced in the light that enters the phase shift material layer 214 and passes through the phase shift material 214 is about 180 degrees. Embodiments in accordance with the present disclosure are not limited to producing a 180° phase shift. For example, in other embodiments, the desired phase shift may be greater than or less than 180°. Unlike the embodiment of FIG. 1A in which the etch stop layer was only semi-transmissive to the incident light, etch stop layer 216 in the embodiment of FIG. 1B is essentially completely transmissive to incident light. Accordingly, the phase of light that is incident on etch stop layer 216 and is transmitted through etch stop layer 216 is virtually unchanged. In other words, the phase shift produced in the incident light that passes through the phase shift material layer 214 relative to light that is incident on etch stop layer 216 that has not passed through phase shift material layer 214 will be maintained after both types of light pass through the etch stop layer 216.

In some embodiments, the transmission of incident light that enters the phase shift material layer 214 and passes through the phase shift material layer 214 compared to the transmission of the incident light that does not pass through the phase shift material layer 214 can be adjusted by changes in the absorption coefficient of the phase shift material layer 214. In addition, the transmission of light incident on etch stop layer 216 can be adjusted by altering the absorption coefficient of the material of the etch stop layer 216.

The refractive index of the phase shift material layer 214 can be adjusted in the same way that the refractive index of phase shift material layer 204 can be adjusted as described above.

In accordance with embodiments of the present disclosure, the transmission of incident light by the phase shift material layer 214 can be adjusted by adjusting the incident light absorption coefficient of the phase shift material layer 214. For example, increasing the absorption coefficient of the phase shift material layer 214 will decrease the transmission of incident light through the phase shift material layer 214. Decreasing the absorption coefficient of the phase shift material layer 214 will increase the transmission of incident light through the phase shift material layer 214. The absorption coefficient of the phase shift material layer 214 can be adjusted as described above with respect to adjusting the absorption coefficient of the phase shift material layer 204.

In accordance with embodiments of the present disclosure, the transmission of incident light by the etch stop layer 216 can be adjusted by adjusting the absorption coefficient of the etch stop layer 216. For example, increasing the absorption coefficient of the etch stop layer 216 will decrease the transmission of incident light through the etch stop layer 216. Decreasing the absorption coefficient of the etch stop layer 216 will increase the transmission of incident light through the etch stop layer 216. The absorption coefficient of the etch stop layer 216 can be adjusted by in the same way as described above with respect to etch stop layer 206.

In accordance with some embodiments, the phase shift layer 214 has a thickness between 30 and 100 nanometers. Embodiments in accordance with the present disclosure are not limited to a phase shift layer 214 that has a thickness within the foregoing range. For example, in other embodiments, the phase shift layer may have a thickness that below the foregoing range or above the foregoing range.

Materials useful as the phase shift layer 214 include MoSi compounds and the like. For example, phase shift layer 214 includes MoSi compounds such as MoSi, MoSiCON, MOSiON, MoSiCN, MoSiCO, MoSiO, MoSiC and MoSiN. Embodiments in accordance with the present disclosure are not limited to phase shift layers utilizing the foregoing MoSi compounds. In other embodiments, phase shift layer 214 includes compounds other than MoSi compounds that are capable of shifting the phase of light incident on the phase shift layer, e.g., for example, by 180 degrees.

The phase shift layer 214 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 506, a patterning layer 250 is deposited over the phase shift material layer 214. In some embodiments, the patterning layer 250 is patterned and utilized as a mask for patterning the phase shift material layer 214. In addition, as noted above, peripheral portions of the patterning layer 250 are patterned to form image border features 250P around a periphery of an image region 252 of the APSM mask 211.

In some embodiment, the patterning layer 250 includes metals, metal oxides, or other suitable materials. For example, the patterning layer 250 may include a tantalum-containing material (for example, Ta, TaN, TaNH, TaHF, TaHfN, TaBSi, TaB SiN, TaB, TaBN, TaSi, TaSiN, TaGe, TaGeN, TaZr, TaZrN, other tantalum-containing material, or combinations thereof), a chromium-containing material (for example, Cr, CrN, CrO, CrC, CrON, CrCN, CrOC, CrOCN, other chromium-containing material, or combinations thereof), a titanium-containing material (for example, Ti, TiN, other titanium-containing material, or combinations thereof), other suitable material, or combinations thereof. The material of the patterning layer 250 is not limited herein and may include other materials that are able to block incident light and exhibit selective etching or removal characteristics relative to the phase shift material layer 214 and hard mask layer 218.

In some embodiments of the present disclosure, the patterning layer 250 is 5 to 50 nm thick. The patterning layer 250 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 508, hard mask layer 218 is formed over patterning layer 250. As described below in more detail, hard mask layer 218 will be patterned and the pattern of the hard mask layer 218 will be transferred to patterning layer 250. In some embodiments, the hard mask layer 218 includes a material that protects the patterning layer 250 of the mask 211. In some embodiment, the materials of the hard mask layer 218 and the patterning layer 250 have similar properties relative to materials used to remove the passivation layer and photoresist layer 210 described below and different properties relative to materials used to etch the hard mask layer 218. In some embodiments, the hard mask layer 218 includes a chromium-containing material, such as Cr, CrN, CrO, CrC, CrON, CrCN, CrOC, CrOCN, other chromium-containing material, or combinations thereof. When the hard mask layer 218 is selected from these chromium-containing materials, the material chosen for the patterning layer 250 is a material that can be selectively etched relative to the material of the hard mask layer 218. For example, when the hard mask layer is a chromium-containing material, the patterning layer 250 is not a chromium-containing material. In some alternative embodiments, the hard mask layer 218 includes a tantalum-containing material, such as Ta, TaN, TaNH, TaHF, TaHfN, TaBSi, TaB SiN, TaB, TaBN, TaSi, TaSiN, TaGe, TaGeN, TaZr, TaZrN, other tantalum-containing material, or combinations thereof which can be etched with a fluorine-containing etchant.

In some embodiments, the hard mask layer 218 has a thickness of about 3.5 nm to about 5 nm. The hard mask layer 218 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD, low-pressure CVD, plasma enhanced CVD or high-density plasma CVD), ion beam deposition, spin on coating, metal-organic decomposition (MOD), other suitable methods, or combinations thereof.

In operation 510, a photoresist layer 260 is deposited over the hard mask layer 218. Photoresist layer 260 is patterned as described below in more detail and the patterned photoresist is used as a mask to pattern the underlying hard mask layer 218. In some embodiments, the photoresist will be patterned as described below in more detail and such pattern will be transferred onto the phase shift material layer 214 in subsequent processes. In some embodiments, the photoresist layer 260 may be a chemically amplified resist that employs acid catalysis. For example, the photoresist of the photoresist layer 260 may be formulated by dissolving an acid sensitive polymer in a casting solution. In some embodiments, the photoresist of the photoresist layer 260 may be a positive tone photoresist which would render the patterns subsequently formed having the same contour as the patterns on a mask (not illustrated). In some alternative embodiments, the photoresist of the photoresist layer 260 may be a negative tone photoresist which would render the patterns subsequently formed having openings corresponding to the patterns on the mask (not illustrated). The photoresist layer 260 may be formed by spin coating or other similar techniques.

Figure 3B:
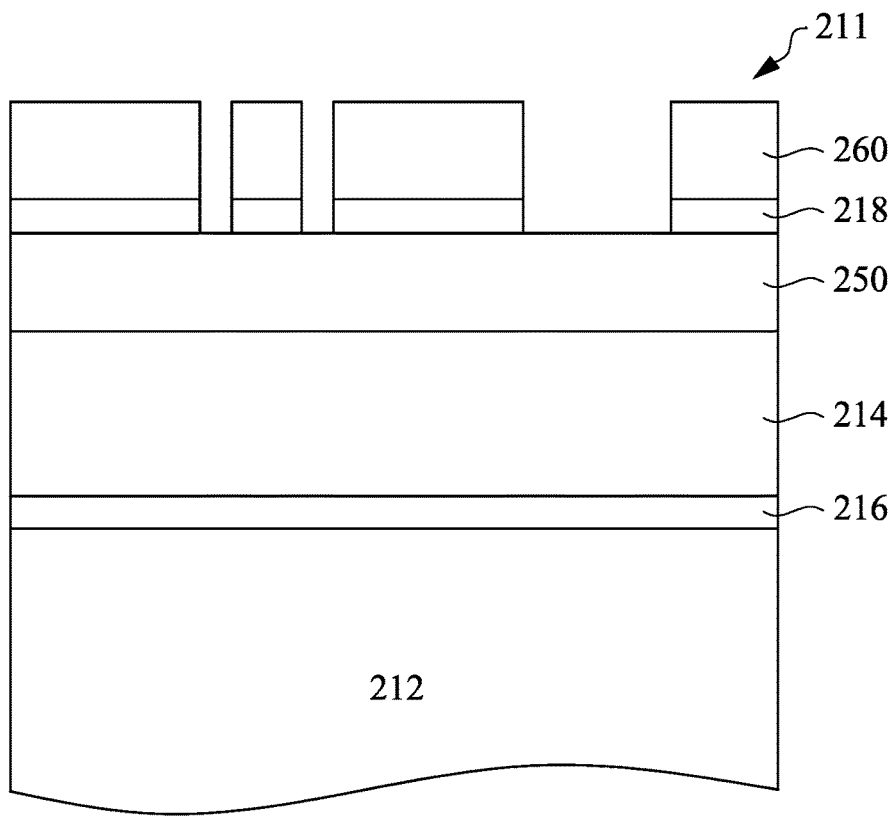

Referring to FIG. 3B, an intermediate structure of mask 211 after patterning of photoresist layer 260 and hard mask 218 is illustrated. Referring additionally to FIG. 5, at operation 512, the photoresist layer 260 is patterned by performing an exposure process on the photoresist layer 260. The exposure process may include a lithography technique with a mask (for instance, a photolithography process) or a mask-less lithography technique (for instance, an electron-beam (e-beam) exposure process or an ion-beam exposure process). After the exposure process, a post-baking process may be performed to harden at least a portion of the mask layer. Depending on the material(s) or type(s) of the photoresist layer 260, polymers of the photoresist layer may undergo different reactions (chain scission or cross-linking of polymers) upon the irradiation of the light beam and baking. Thereafter, a development process is performed to remove at least a portion of the photoresist layer. In some embodiments, portions of the positive resist material exposed to the light beam may undergo chain scission reaction, resulting the exposed portions to be easily removed by a development agent as compared to other portions not exposed to the light beam. On the other hand, portions of the negative resist material exposed to the light beam may undergo the cross-linking reaction, the resulting exposed portions will be harder to remove by a development agent as compared to other portions not exposed to the light beam. In some embodiments, after development of the photoresist layer 260, portions of the underlying hard mask layer 218 are exposed.

Continuing to refer to FIG. 3B, after development of photoresist layer 260 is complete, at operation 514, hard mask layer 218 is etched through the openings in the developed photoresist layer 260. The hard mask layer 218 is patterned by etching the exposed portions of the hard mask layer 218 through the openings in the developed photoresist layer 260. The etching process can include a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters so as to be selective for the material of the hard mask layer 218 relative to other materials that will be exposed to the etchant during the etching of hard mask layer 218. In some embodiments, fluorine containing etchants are used in the removal of portions of phase shift layer 204. Examples of fluorine containing etchants include fluorine containing gases such as $CF_4$, $CHF_3$, $C_2F_6$, $CH_2F_2$, $SF_6$ or combinations thereof.

At operation 516, the patterned photoresist layer 260 is removed to expose the portions of the hard mask 218 that remain. The patterned photoresist layer 260 can be removed by wet stripping or plasma ashing. At operation 518, the pattern in hard mask layer 218 is transferred to the patterning layer 250 by etching patterning layer 250 through the openings in the hard mask layer 218. Etching of the patterning layer 250 is carried out by exposing the patterning layer 250 to etchants that are selective for the materials of the patterning layer 250 compared to other materials that will be exposed to the etching material during the step of etching the patterning layer 250, such as the hard mask 218. The etching process can include a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters so as to be selective for the material of the patterning layer 250 relative to other materials that will be exposed to the etchant during the etching of patterning layer 250, such as the patterned hard mask layer 218. In some embodiments, the etching process of the patterning layer 250 uses a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof). In other embodiments, when the patterning layer is susceptible to etching with fluorine-containing etchants and the hard mask 218 is resistant to etching by a fluorine-containing etchant, the etching process of the patterning layer 250 uses a fluorine-containing etchant.

Figure 3C:
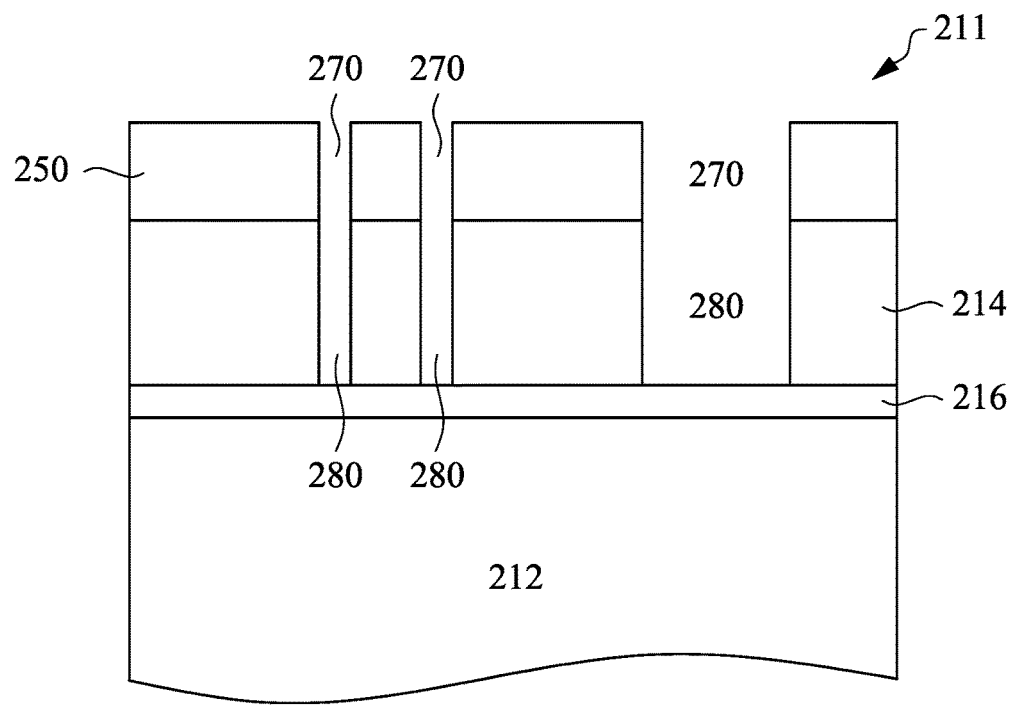
Figure 3D:
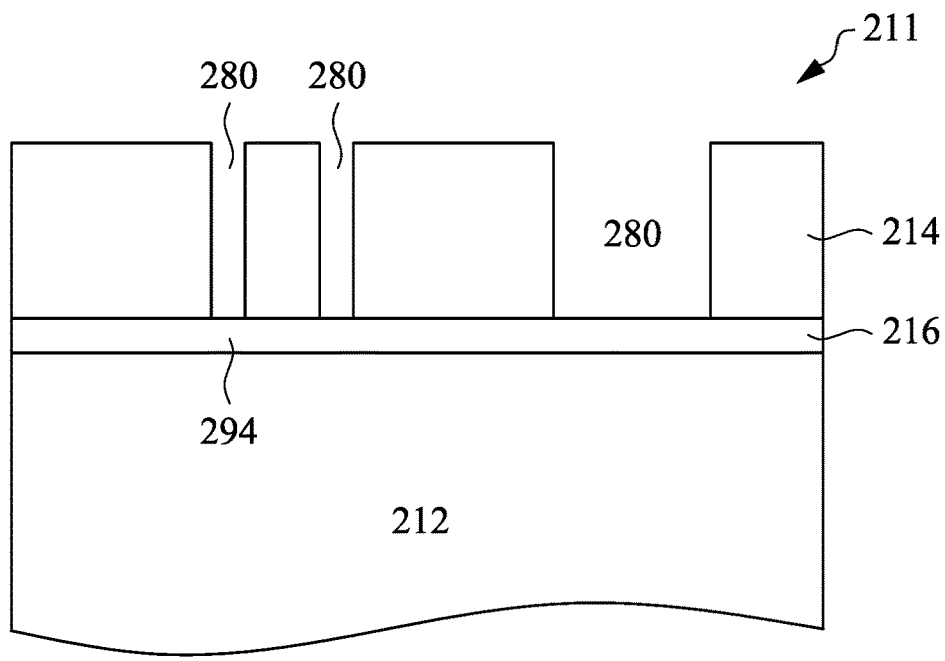

Referring to FIG. 3C, an intermediate structure of mask 211 after phase shift material layer 214 has been patterned with the pattern of patterned patterning layer 250, is illustrated. In FIG. 3C, the patterned photoresist layer 260 and patterned hard mask layer 218 have been removed as described above. Referring to FIG. 5, in operation 522, the pattern of the patterned patterning layer 250 is transferred to the phase shift material layer 214 by etching phase shift material layer 214 through the openings 270 in patterning layer 250. Patterning of phase shift material layer 214 exposes portions of stopping layer 216 through openings 280 in phase shift material layer 214. Etching of phase shift material layer 214 is accomplished by exposing portions of the phase shift material layer 214 exposed through openings 270 in patterning layer 250 to an etchant that is selective for the material of the phase shift material layer 214 relative to the material of the patterning layer 250 and the material of the stopping layer 216. The etching process can include a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters so as to be selective for the material of the phase shift material layer 214 relative to other materials that will be exposed to the etchant during the etching of phase shifting material layer 214, such as the patterned hard patterning layer 250 and underlying etch stop layer 216. In some embodiments, fluorine containing etchants are used in the removal of portions of phase shift layer 214. Examples of fluorine containing etchants include fluorine containing gases such as $CF_4$, $CHF_3$, $C_2F_6$, $CH_2F_2$, $SF_6$ or combinations thereof. After transfer of the pattern of the patterning layer 250 to the phase shift material layer 214 is complete, the patterned patterning layer 250 is removed at operation 524, e.g., by a wet etching or plasma etching process. FIG. 3D illustrates a mask 211 in accordance with an embodiment of the present disclosure after patterning layer 250 has been removed at operation 524.

Figure 3E:
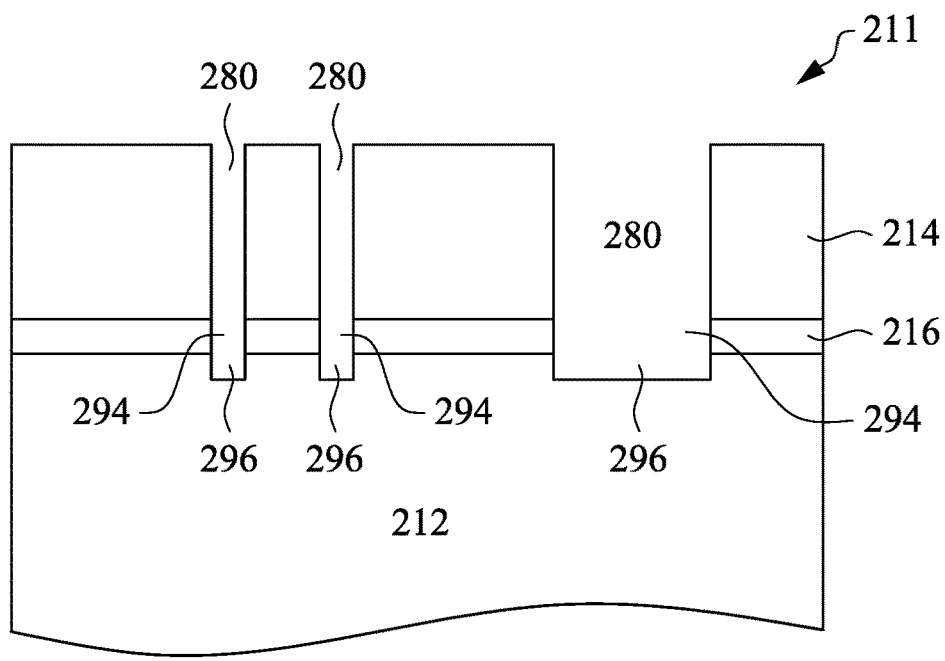

Referring to steps 526 and 528 of FIG. 5 and to FIG. 3E, in accordance with some embodiments, method 500 further includes step 526 of removing portions of etch stop layer 216. Removing portions of etch stop layer 216 produces openings 294 in etch stop layer 216 through which portions of substrate 212 are exposed. Etching of etch stop layer 216 in step 526 is accomplished by contacting portions of etch stop layer 216 that are exposed through openings 280 in phase shift material layer 214 with an etchant that is selective for the material of the etch stop layer 216 and not selective for the material of phase shift material layer 214 and substrate 212. At step 528, in accordance with some embodiments, method 500 includes the step of removing portions of substrate 212. Removing portions of substrate 212 produces trenches 296 in substrate 212. Removing portions of substrate 212 in step 528 is accomplished by contacting portions of substrate 212 exposed through openings 294 in etch stop layer 216 to an etchant that is selective towards the substrate 212 and not selective towards the material of etch stop layer 216 and the material of phase shift material layer 214. FIG. 3E illustrates a mask structure 211 in accordance with some embodiments of the present disclosure where portions of etch stop layer 216 and substrate 212 have been removed as described above. Etching substrate 212 after etching of etch stopping layer 216 has been completed, provides an opportunity to more carefully control the etching of substrate 212 so that unwanted shifts in phase or transmission intensity due to over etching or under etching of substrate are avoided or reduced.

After removal of patterning layer 250 is completed (or in alternative embodiments, after removal of portions of etch stop layer 216 or portions of substrate 212), the mask 211 is cleaned to remove any contaminants therefrom. In some embodiments, the mask 211 is cleaned by submerging the mask 211 into an ammonium hydroxide ($NH_4OH$) solution.

The mask 211 is subsequently radiated with, for example, an UV light with a wavelength of 193 nm, for inspection of any defects in the patterned region 252. The foreign matters may be detected from diffusely reflected light. If defects are detected, the mask 211 is further cleaned using suitable cleaning processes.

A mask 211 useful in a semiconductor lithography process is thus formed. The mask 211 of FIG. 3D includes a substrate 212, a transmissive etch stop layer 216 over the substrate 212 and a patterned phase shift material layer 214 over the transmissive etch stop layer 216. According to this embodiment, the etch stop layer 216 does not include the pattern of the patterned phase shift material layer and has protected the underlying substrate 212 from etchants used during the mask formation process that might otherwise etch the substrate 212. The etch stop layer is transmissive to incident light, e.g., DUV, NUV or light used in immersive lithography processes, such as light from an ArF excimer laser having a wavelength of about 193 nm, in some embodiments over 99% transmissive of such light. As noted above, the thickness of the phase shift material layer 214, its index of refraction and incident light absorption characteristics are chosen to provide a desired phase shift of the light incident on mask 211, e.g., 180 degrees, and to provide a desired level of light transmission through the phase shift material layer 214. Due to the highly transmissive property of the etch stop layer 216 in this embodiment, unlike the embodiment of FIG. 1A which includes a semi-transmissive etch stop layer 206, the etch stop layer 216 has very little impact on the phase shift of light incident on mask 211 or the absorption of incident light in the etch stop layer 216. Accordingly, the thickness of the etch stop layer 216, its index of refraction and incident light absorption characteristics are of less concern than those properties of etch stop layer 206. As with mask 200, the amount of phase shift imparted to light passing through mask 211 can also be adjusted by adjusting the incident angle of light on the mask 211. As a result, a pattern on the mask 211 can be projected onto a silicon wafer to produce precise and reproducible patterns.

Figure 6:
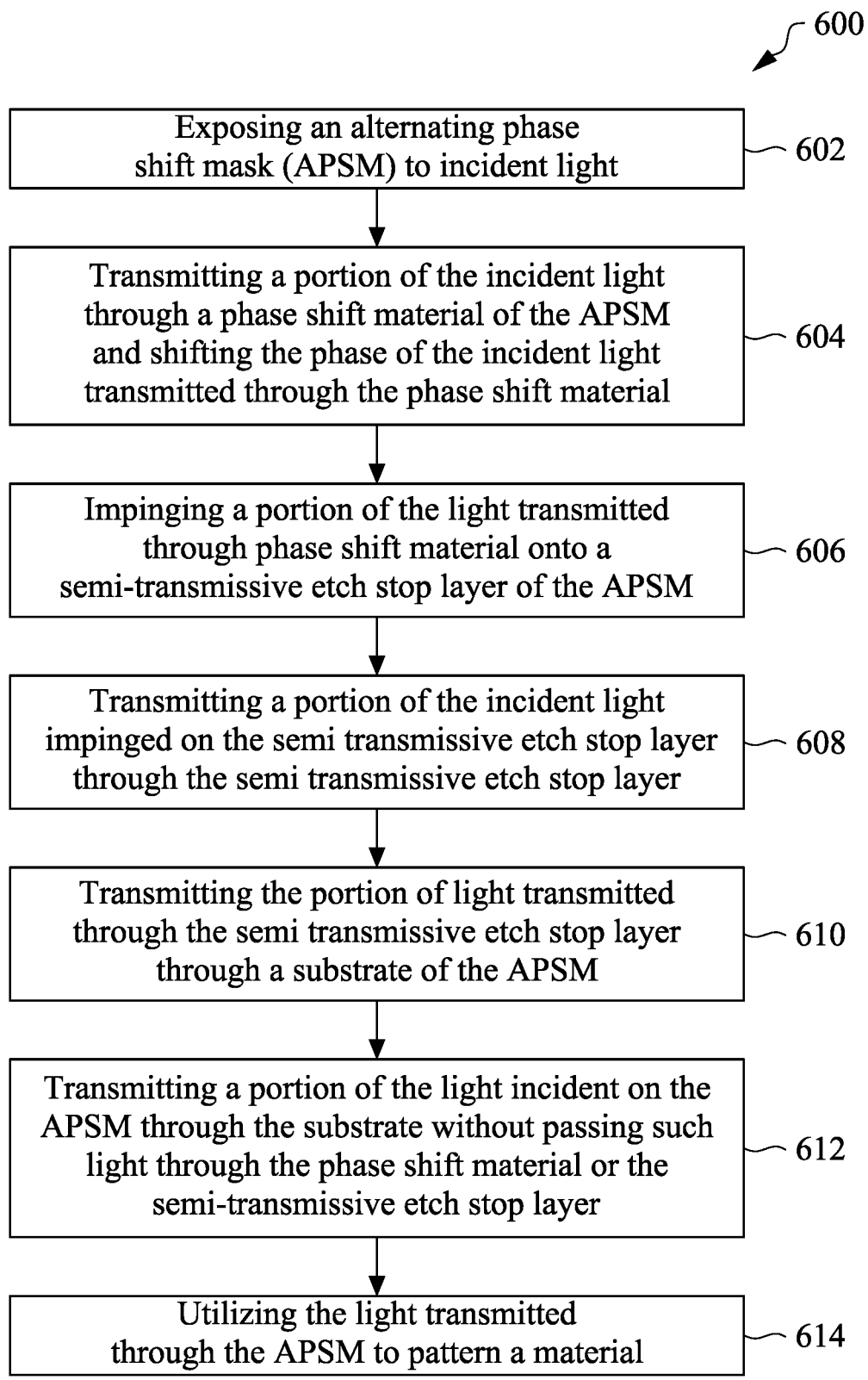
FIG. 6 is a flowchart of a method of using a lithography mask in accordance with embodiments of the present disclosure.

Lithography masks formed in accordance with the present disclosure are useful in processes for patterning material layers on a semiconductor substrate. Referring to FIG. 6, in accordance with an embodiment, such a method 600 includes step 602 of exposing a phase shift mask formed in accordance with the present disclosure to incident light in an immersive lithography process, e.g., light having a wavelength on the order of about 193 nm. Embodiments of masks in accordance with the present disclosure are not limited to masks useful in immersive lithography processes or with light having a wavelength of about 193 nm. For example, masks in accordance with embodiments of the present disclosure are useful in lithography processes that utilize light in the DUV portion of the spectrum or the NUV portion of the spectrum. An example of a phase shift mask useful in method 600 includes the mask 200 of FIG. 1A. At step 604, a portion of the light incident on the phase shift material of the APSM is transmitted through the phase shift material which imparts a phase shift to the incident light transmitted to the phase shift material. An example of a phase shift material useful in method 600 includes phase shift material layer 204 of FIG. 1A. At step 606, a portion of the light transmitted through the phase shift material impinges on to a semi-transmissive etch stop layer of the APSM. An example of a semi-transmissive etch stop layer useful in method 600 includes semi-transmissive etch stop layer 206 in FIG. 1A. At step 608, a portion of the incident light that impinges on the semi-transmissive etch stop layer is transmitted through the semi-transmissive etch stop layer. At step 610, the portion of light transmitted through the semi-transmissive etch stop layer is transmitted through a substrate of the APSM. An example of a substrate useful in method 600 includes substrate 202 in FIG. 1A. This light has been phase shifted due to passing through the phase shift material and through the semi-transmissive etch stop layer. In addition, the intensity of light incident on mask 200 may have been attenuated due to passing through the phase shift material and/or the semi-transmissive etch stop layer. Simultaneously with the transmission of incident light through the phase shift material and the semi-transmissive etch stop layer, at step 612, a portion of the light incident on the APSM is transmitted through the substrate of the APSM without passing through the phase shift material or the semi-transmissive etch stop layer. The phase of the light transmitted through the substrate of the APSM without passing through the phase shift material or the semi-transmissive etch stop layer remains relatively unchanged. In addition, the amount of light transmitted through the substrate of the APSM without passing through the phase shift material or the semi-transmissive etch stop layer may be about 99% or more of the light incident on the mask 200. The light that has been transmitted through the substrate of the APSM is then used at step 614 to pattern a material on a semiconductor substrate.

Figure 7:
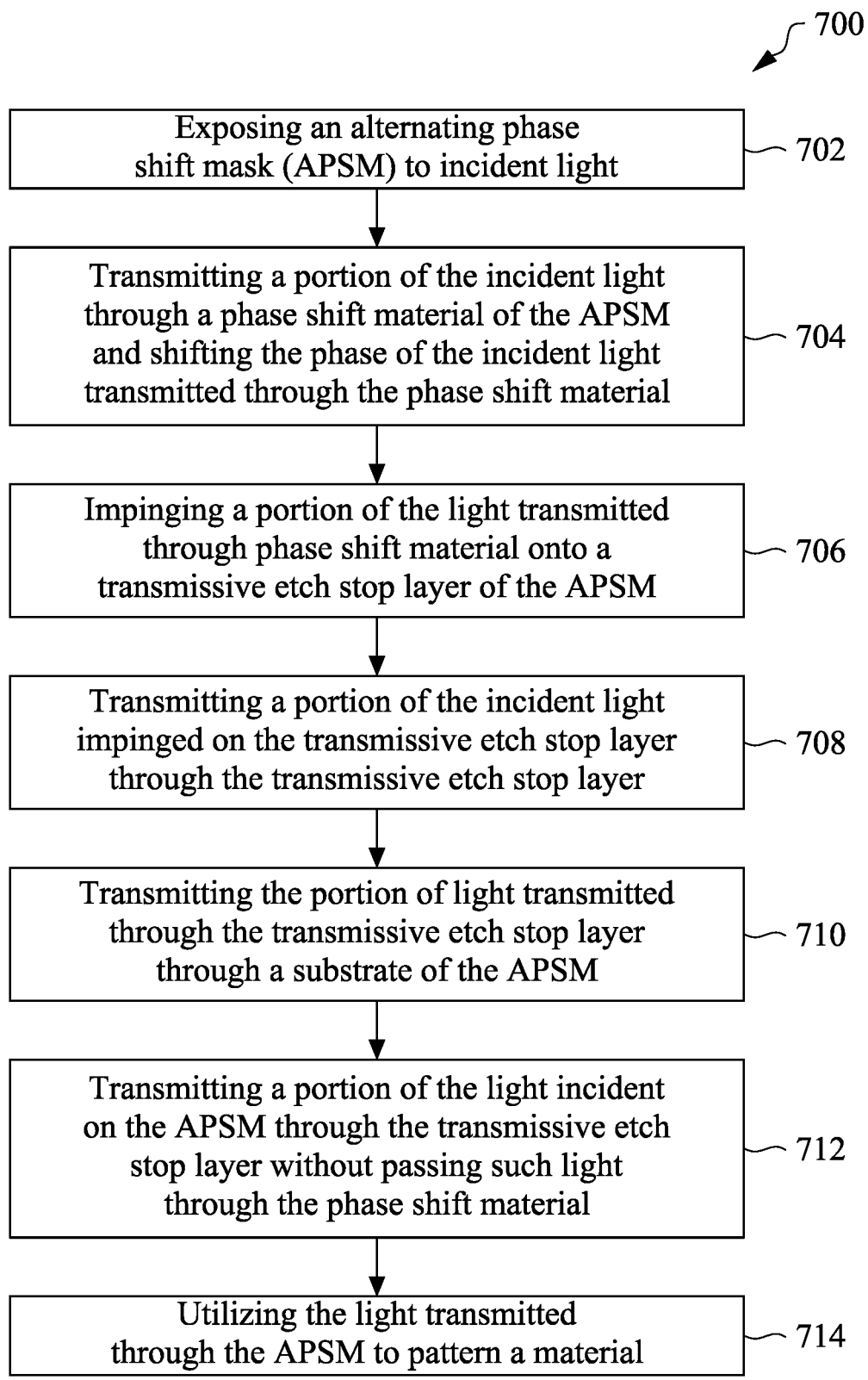
FIG. 7 is a flowchart of a method of using a lithography mask in accordance with embodiments of the present disclosure

In accordance with another embodiment of the present disclosure, an mask formed in accordance with embodiments illustrated in FIG. 1B is useful in processes for patterning material layers on a semiconductor substrate. Referring to FIG. 7, in accordance with an embodiment, such a method 700 includes step 702 of exposing a phase shift mask formed in accordance with the present disclosure to incident light. An example of an APSM useful in method 700 includes the lithgography mask 211 of FIG. 1B. At step 704, a portion of the light incident on the phase shift material of the APSM is transmitted through the phase shift material which imparts a phase shift to the incident light transmitted to the phase shift material. An example of a phase shift material useful in method 700 includes phase shift material layer 214 of FIG. 1B. At step 706, a portion of the light transmitted through the phase shift material impinges on a transmissive etch stop layer of the APSM. An example of a transmissive etch stop layer useful in method 700 includes transmissive etch stop layer 216 in FIG. 1B. At step 708, a portion of the incident light that impinges on the transmissive etch stop layer is transmitted through the transmissive etch stop layer. At step 710, the portion of light transmitted through the transmissive etch stop layer is transmitted through a substrate of the APSM. An example of a substrate useful in method 700 includes substrate 212 in FIG. 1B. This light transmitted through the phase shift material has been phase shifted due to passing through the phase shift material. Due to the near 100% transmission of incident light by the etch stop layer, in accordance with this embodiment, transmission of light incident on the transmissive etch stop layer through the transmissive etch stop layer does not impart any significant change in the phase of the transmitted light. Simultaneously with the transmission of incident light through the phase shift material and the transmissive etch stop layer, at step 712, a portion of the light incident on the APSM is transmitted through the transmissive etch stop layer of the APSM without passing through the phase shift material. The phase of the light transmitted through the transmissive etch stop layer without passing through the phase shift material remains relatively unchanged. The light transmitted through the transmissive etch stop layer is transmitted through the substrate. The light that is transmitted through the substrate of the APSM is then used at step 714 to pattern a material on a semiconductor substrate.

One aspect of this description relates to a lithography mask, e.g., an alternating phase shift mask. The mask includes a substrate, a phase shift layer on the substrate and a semi-transmissive etch stop layer between the substrate in the phase shift layer. The phase shift layer is patterned and the pattern of the phase shift layer is also present in the semi-transmissive etch stop layer. Examples of materials for the semi-transmissive etch stop layer include CrON, Ru, Ru—Nb, Ru—Zr, Ru—Ti, Ru—Y, Ru—B and Ru—P Another aspect of this description relates to a lithography mask, e.g., an alternating phase shift mask. In this aspect, the mask includes a substrate, a patterned phase shift layer on the substrate and a transmissive etch stop layer between the substrate and the patterned phase shift layer. In this aspect, the etch stop layer does not include the pattern of the patterned phase shift layer. An example of a transmissive etch stop layer includes an etch stop layer formed of a material of the chemical formula $Al_xSi_yO_z$ where x+y+z=1.

Still another aspect of this description relates to a method of forming a lithography mask. The method includes forming an etch stop layer on the substrate. A phase shift layer is then formed on the etch stop layer. A patterning layer is then formed on the phase shift layer. Next, a patterned hard mask layer is formed on the patterning layer. The patterning layer is then etched to form a plurality of openings in the patterning layer using the patterned hard mask layer as an etch mask. The plurality of openings in the patterning layer expose portions of the surface of the phase shift layer. The exposed portions of the phase shift layer are then etched to form a plurality of openings in the phase shift layer using the etched patterning layer as an etch mask. The plurality of openings in the phase shift layer expose surfaces of the etch stop layer. In some embodiments of the method, the etch stop layer is selected from CrON, Ru, Ru—Nb, Ru—Zr, Ru—Ti, Ru—Y, Ru—B and Ru—P. In other embodiments, the etch stop layer is selected from a material having a chemical formula $Al_xSi_yO_z$ where x+y+z=1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography mask, comprising:
    a substrate;
    a semi-transmissive etch stop layer on the substrate, wherein the semi-transmissive etch stop layer comprises a material selected from Ru—Nb, Ru—Zr and Ru—Y;
    a phase shift layer on the semi-transmissive etch stop layer, wherein the phase shift layer is selected from MoSi, MoSiCON, MoSiCN, MoSiCO and MoSiC, and the semi-transmissive etch stop layer is between the substrate and the phase shift layer, at least a portion of the semi-transmissive etch stop layer not overlapped by the phase shift layer; and an image border feature on the phase shift layer, the image border feature including a material that has a light blocking characteristic and the image border feature overlapping the phase shift layer only in a border region.

2. The lithography mask of claim 1, wherein the substrate is formed of quartz.

3. The lithography mask of claim 1, wherein the phase shift layer is capable of shifting the phase of light incident on the phase shift layer by 180 degrees.

4. The lithography mask of claim 1, wherein the semi-transmissive etch stop layer transmits up to 70% of light incident on the semi-transmissive etch stop layer.

5. The lithography mask of claim 1, further comprising a patterned layer on the phase shift layer, wherein the patterned layer includes a tantalum-containing material selected from TaHf, TaHfN, TaBSi, TaBSiN, TaSi, TaSiN, TaGe, TaGeN, TaZr and TaZrN, and the patterned layer includes the image border feature.

6. A lithography mask, comprising:
a quartz substrate;
a patterned semi-transmissive etch stop layer on the quartz substrate, wherein the patterned semi-transmissive etch stop layer comprises Ru—Y; and
a patterned phase shift layer including an MoSi compound on the patterned semi-transmissive etch stop layer.

7. The lithography mask of claim 6, wherein the phase shift layer is selected from MoSi, MoSiCON, MoSiON, MoSiCN, MoSiCO, MoSiO, MoSiC and MoSiN.

8. The lithography mask of claim 6, wherein the patterned semi-transmissive etch stop layer transmits up to 70% of light incident on the patterned semi-transmissive etch stop layer.

9. The lithography mask of claim 6, wherein the quartz substrate is patterned.

10. The lithography mask of claim 6, wherein the patterned semi-transmissive etch stop layer is 1-20 nanometers thick.

11. A method of forming a lithography mask, comprising:
forming an etch stop layer on a substrate, wherein the etch stop layer comprises Ru—Y;

forming a phase shift layer on the etch stop layer, wherein the phase shift layer comprises an MoSi-containing compound doped with an element selected from B, C, Al, Ge, Sn and Ta;

forming a patterning layer on the phase shift layer, the patterning layer including a material that has a light blocking characteristic;

forming a patterned hard mask layer on the patterning layer;

etching the patterning layer to form a plurality of openings in the patterning layer using the patterned hard mask layer as an etch mask, the plurality of openings exposing a surface of the phase shift layer;

etching the phase shift layer to form a plurality of openings therein using the etched patterning layer as an etch mask, the plurality of openings in the phase shift layer exposing a surface of the etch stop layer; and etching the etch stop layer through the plurality of openings in the phase shift layer to form a plurality of openings in the etch stop layer, the plurality of openings in the etch stop layer exposing a surface of the substrate.

12. The method of claim 11, further comprising etching the substrate through the plurality of openings in the etch stop layer.

13. The method of claim 11, wherein the etching the patterning layer includes etching the patterning layer with a chlorine-containing etchant.

14. The method of claim 11, wherein the etching the phase shift layer includes etching the phase shift layer with a fluorine-containing etchant.

15. The method of claim 11, wherein the etching the etch stop layer includes etching the etch stop layer with a chlorine-containing etchant.

16. The method of claim 11, wherein the etching the phase shift layer includes isolating the substrate from an etchant used to etch the phase shift layer.

17. The method of claim 11, wherein etching the phase shift layer includes removing portions of the patterned hard mask layer.

18. The method of claim 11, wherein the patterning layer comprises a tantalum-containing material, a chromium-containing material, a titanium-containing material or combinations thereof.

* * * * *